(12) United States Patent
Kokusho

(10) Patent No.: US 10,771,079 B2
(45) Date of Patent: Sep. 8, 2020

(54) AD CONVERTER

(71) Applicant: Rohm Co., Ltd., Kyoto (JP)

(72) Inventor: Yuichi Kokusho, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/700,811

(22) Filed: Dec. 2, 2019

(65) Prior Publication Data

US 2020/0186159 A1   Jun. 11, 2020

(30) Foreign Application Priority Data

Dec. 6, 2018 (JP) ................................ 2018-228802

(51) Int. Cl.
*H03M 1/10* (2006.01)
*H03M 1/46* (2006.01)
(52) U.S. Cl.
CPC ....... *H03M 1/1071* (2013.01); *H03M 1/1028* (2013.01); *H03M 1/46* (2013.01)
(58) Field of Classification Search
CPC ..... H03M 1/1071; H03M 1/1028; H03M 1/46
USPC ................................. 341/155, 120
See application file for complete search history.

(56) References Cited

U.S. PATENT DOCUMENTS 9,654,327 B2* 5/2017 Liao .................... H04L 27/3809
9,748,964 B1* 8/2017 Kabir .................... H03M 1/123
9,998,138 B1* 6/2018 Wang .................... H03M 1/462

FOREIGN PATENT DOCUMENTS

JP   2009-267471   11/2009

* cited by examiner

*Primary Examiner* — Brian K Young
(74) *Attorney, Agent, or Firm* — Fish & Richardson P.C.

(57) ABSTRACT

There provided an AD converter that includes an analog processing part configured to select one of the measurement target voltages and a plurality of reference voltages for each channel, to output an analog voltage signal; a first selection part configured to select one of a plurality of analog voltage signals; a first AD conversion part configured to perform AD conversion on the analog voltage signal to generate a first original digital signal; a second selection part configured to select one of the plurality of analog voltage signals; a second AD conversion part configured to perform AD conversion on the analog voltage signal to generate a second original digital signal; a digital processing part configured to receive the first original digital signal and the second original digital signal; and a controller configured to control contents selected in the analog processing part, the first selection part, and the second selection part.

10 Claims, 15 Drawing Sheets

FIG. 9

[Individual setting method MTD1]

- For first channel,
  $V_{REF}[1](=V_{SEL}[1]$; For example, 0.5V) original digital signal corresponding to $V_{DO\_M}$
- For first channel,
  $V_{REF}[2](=V_{SEL}[1]$; For example, 1.0V) original digital signal corresponding to $V_{DO\_M}$ } → Main filter parameter for first channel

- For second channel,
  $V_{REF}[1](=V_{SEL}[2]$; For example, 0.5V) original digital signal corresponding to $V_{DO\_M}$
- For second channel,
  $V_{REF}[2](=V_{SEL}[2]$; For example, 1.0V) original digital signal corresponding to $V_{DO\_M}$ } → Main filter Parameter for second channel

- For first channel,
  $V_{REF}[1](=V_{SEL}[1]$; For example, 0.5V) original digital signal corresponding to $V_{DO\_S}$
- For first channel,
  $V_{REF}[2](=V_{SEL}[1]$; For example, 1.0V) original digital signal corresponding to $V_{DO\_S}$ } → Main filter parameter for first channel

- For second channel,
  $V_{REF}[1](=V_{SEL}[2]$; For example, 0.5V) original digital signal corresponding to $V_{DO\_S}$
- For second channel,
  $V_{REF}[2](=V_{SEL}[2]$; For example, 1.0V) original digital signal corresponding to $V_{DO\_S}$ } → Main filter Parameter for second channel

FIG. 10

[Common setting method MTD2]

- For representative channel (first channel), $V_{REF}[1](=V_{SEL}[1];$ For example, 0.5V) original digital signal corresponding to $V_{DO\_M}$
- For representative channel (first channel), $V_{REF}[2](=V_{SEL}[1];$ For example, 1.0V) original digital signal corresponding to $V_{DO\_M}$ $\rightarrow$ Main filter parameter common to all channels

- For representative channel (first channel), $V_{REF}[1](=V_{SEL}[1];$ For example, 0.5V) original digital signal corresponding to $V_{DO\_S}$
- For representative channel (first channel), $V_{REF}[2](=V_{SEL}[1];$ For example, 1.0V) original digital signal corresponding to $V_{DO\_S}$ $\rightarrow$ Main filter parameter common to all channels

AD CONVERTER

CROSS-REFERENCE TO RELATED APPLICATION

This application is based upon and claims the benefit of priority from Japanese Patent Application No. 2018-228802, filed on Dec. 6, 2018, the entire contents of which are incorporated herein by reference.

TECHNICAL FIELD

The present disclosure relates to an AD converter.

BACKGROUND

FIG. 18 illustrates a configuration of an AD converter 900 that can perform analog-digital conversion (AD conversion) on measurement target voltages for a plurality of channels. In the AD converter 900, the measurement target voltages for the plurality of channels are input to an analog processing part 910. The analog processing part 910 generates a plurality of analog voltage signals corresponding to the measurement target voltages for the plurality of channels (analog voltage signals for the plurality of channels) through a process of generating a divided voltage of each of the measurement target voltages or amplifying each of the measurement target voltages. A signal selection part 920 includes a multiplexer, and selects one of the plurality of analog voltage signals from the analog processing part 910 to output the selected analog voltage signal to an AD conversion part 930. At this time, amplification (impedance conversion) of the selected analog voltage signal or high frequency reduction processing is appropriately executed. The AD conversion part 930 performs AD conversion on the analog voltage signal provided from the signal selection part 920 to obtain a digital signal. By sequentially switching channels selected by the multiplexer, it is possible to sequentially perform AD conversion on the measurement target voltages for the plurality of channels in a time division manner.

In the AD converter 900 of FIG. 18, various abnormalities (failures) may occur. For example, an abnormality in which the multiplexer in the signal selection part 920 cannot normally perform a selection operation, an abnormality in which a wiring for propagating an output signal of the analog processing part 910 is grounded or short-circuited, or an abnormality in which a wiring for propagating an output signal of the signal selection part 920 is grounded or short-circuited may occur. In addition, an abnormality in which a gain error or an offset error of the AD conversion part 930 becomes excessive beyond a design range may occurs.

However, the AD converter 900 of FIG. 18 cannot recognize the occurrence of such an abnormality even if the abnormality has occurred. If an abnormality can be recognized when it occurs, there is a great merit that a protection operation corresponding to the abnormality (for example, an operation stop or failure notification based on an erroneous AD conversion result) can be performed.

Furthermore, although the AD converter that performs AD conversion on the measurement target voltages for the plurality of channels has been described, similar situation exists for an AD converter that performs AD conversion on one measurement target voltage (however, the latter AD converter does not have any abnormality regarding the signal selection part 920).

SUMMARY

Some embodiments of the present disclosure provide an AD converter capable of evaluating validity of a circuit for obtaining an AD conversion result of a measurement target voltage or an AD converter that contributes to detection of an abnormality in operation, in other words, of a circuit or operation for obtaining an AD conversion result of a measurement target voltage.

According to one embodiment of the present disclosure, there is provided an analog-digital (AD) converter for performing AD conversion on measurement target voltages for a plurality of channels, which includes an analog processing part configured to select one of the measurement target voltages and a plurality of reference voltages for each of the channels, to output an analog voltage signal corresponding to the selected voltage; a first selection part configured to select one of a plurality of analog voltage signals for the plurality of channels output from the analog processing part; a first AD conversion part configured to perform AD conversion on the analog voltage signal selected by the first selection part to generate a first original digital signal; a second selection part configured to select one of the plurality of analog voltage signals; a second AD conversion part configured to perform AD conversion on the analog voltage signal selected by the second selection part to generate a second original digital signal; a digital processing part configured to receive the first original digital signal and the second original digital signal; and a controller configured to control contents selected in the analog processing part, the first selection part, and the second selection part, wherein the plurality of reference voltages include a first reference voltage and a second reference voltage different from each other, and wherein the digital processing part includes: a first filter block having a first filter configured to generate a first corrected digital signal from the first original digital signal based on a first parameter, and configured to set the first parameter based on the first original digital signal obtained when the first reference voltage is selected by the analog processing part and the first original digital signal obtained when the second reference voltage is selected by the analog processing part; a second filter block having a second filter configured to generate a second corrected digital signal from the second original digital signal based on a second parameter, and configured to set the second parameter based on the second original digital signal obtained when the first reference voltage is selected by the analog processing part and the second original digital signal obtained when the second reference voltage is selected by the analog processing part; and an error determination part configured to output a predetermined error determination signal based on the first corrected digital signal and the second corrected digital signal.

As an specific example, the plurality of channels include first to n-th channels (n is an integer of 2 or more), the measurement target voltages for the plurality of channels include first to n-th measurement target voltages, the analog processing part includes first to n-th switch circuits and first to n-th analog wirings, wherein each of the first selection part and the second selection part is connected to the first to n-th analog wirings, and the first to n-th analog voltage signals are input as the plurality of analog voltage signals to each of the first selection part and the second selection part, and in an i-th channel, either an i-th measurement target voltage or the plurality of reference voltages are selected by an i-th switch circuit, and an i-th analog voltage signal corresponding to the selected voltage is applied to an i-th analog wiring (i is an integer of 1 or more and n or less).

As another specific example, a state of the AD converter may be one of an actual measurement state, a first calibration state, and a second calibration state for each channel by the controller, wherein, in the actual measurement state for the i-th channel, the i-th switch circuit, the first selection part, and the second selection part are controlled so that the i-th measurement target voltage is selected by the i-th switch circuit, and the i-th analog voltage signal corresponding to the i-th measurement target voltage is selected by the first selection part and the second selection part, and wherein, in the first calibration state for the i-th channel, the i-th switch circuit, the first selection part, and the second selection part are controlled so that the first reference voltage is selected by the i-th switch circuit, and the i-th analog voltage signal corresponding to the first reference voltage is selected by the first selection part and the second selection part, and wherein, in the second calibration state for the i-th channel, the i-th switch circuit, the first selection part, and the second selection part are controlled so that the second reference voltage is selected by the i-th switch circuit, and the i-th analog voltage signal corresponding to the second reference voltage is selected by the first selection part and the second selection part, and wherein an actual measurement AD conversion operation for performing AD conversion in the first AD conversion part and the second AD conversion part in the actual measurement state, a first calibration AD conversion operation for performing AD conversion in the first AD conversion part and the second AD conversion part in the first calibration state, and a second calibration AD conversion operation for performing AD conversion in the first AD conversion part and the second AD conversion part in the second calibration state are executed for each channel under the control of the controller.

As still another specific example, for a section in which the actual measurement AD conversion operation, the first calibration AD conversion operation, and the second calibration AD conversion operation for the first to n-th channels are executed, the controller includes a section in which the first calibration AD conversion operation for any one channel and the second calibration AD conversion operation for another channel are executed adjacent to each other.

As still another specific example, for a section in which the actual measurement AD conversion operation, the first calibration AD conversion operation, and the second calibration AD conversion operation for the first to n-th channels are executed, the controller includes a section in which the first calibration AD conversion operation for one channel, the second calibration AD conversion operation for another channel, and the actual measurement AD conversion operation for yet another channel are executed adjacent to one another.

As an example, the first filter block is configured to set the first parameter for each channel, wherein the second filter block is configured to set the second parameter for each channel, wherein the first filter block is configured to set the first parameter for the i-th channel based on the first original digital signal obtained from the first AD conversion part when the first reference voltage is selected by the i-th switch circuit and the i-th analog voltage signal is selected by the first selection part, and based on the first original digital signal obtained from the first AD conversion part when the second reference voltage is selected by the i-th switch circuit and the i-th analog voltage signal is selected by the first selection part, and wherein the second filter block is configured to set the second parameter for the i-th channel based on the second original digital signal obtained from the second AD conversion part when the first reference voltage is selected by the i-th switch circuit and the i-th analog voltage signal is selected by the second selection part, and based on the second original digital signal obtained from the second AD conversion part when the second reference voltage is selected by the i-th switch circuit and the i-th analog voltage signal is selected by the second selection part.

As another example, the first filter block is configured to set the first parameter common to the first to n-th channels, wherein the second filter block is configured to set the second parameter common to the first to n-th channels, wherein the first filter block is configured to set the first parameter for the first to n-th channels based on the first original digital signal obtained from the first AD conversion part when the first reference voltage is selected by the first switch circuit and the first analog voltage signal is selected by the first selection part, and based on the first original digital signal obtained from the first AD conversion part when the second reference voltage is selected by the first switch circuit and the first analog voltage signal is selected by the first selection part, and wherein the second filter block is configured to set the second parameter for the first to n-th channels based on the second original digital signal obtained from the second AD conversion part when the first reference voltage is selected by the first switch circuit and the first analog voltage signal is selected by the second selection part, and based on the second original digital signal obtained from the second AD conversion part when the second reference voltage is selected by the first switch circuit and the i-th analog voltage signal is selected by the second selection part.

As still another example, the error determination signal is output based on the error determination part, and a comparison result between a magnitude of a difference between the first corrected digital signal and the second corrected digital signal and a predetermined threshold value.

According to another embodiment of the present disclosure, there is provided an analog-digital (AD) converter for performing AD conversion on measurement target voltages, which includes: an analog processing part configured to select one of the measurement target voltages and a plurality of reference voltages to output an analog voltage signal corresponding to the selected voltage; a first AD conversion part configured to perform AD conversion on the analog voltage signal to generate a first original digital signal; a second AD conversion part configured to perform AD conversion on the analog voltage signal to generate a second original digital signal; a digital processing part configured to receive the first original digital signal and the second original digital signal; and a controller configured to control contents selected in the analog processing part, a first selection part, and a second selection part, wherein the plurality of reference voltages include a first reference voltage and a second reference voltage different from each other, and the digital processing part includes: a first filter block having a first filter configured to generate a first corrected digital signal from the first original digital signal based on a first parameter, and configured to set the first parameter based on the first original digital signal obtained when the first reference voltage is selected by the analog processing part and the first original digital signal obtained when the second reference voltage is selected by the analog processing part; a second filter block having a second filter configured to generate a second corrected digital signal from the second original digital signal based on a second parameter, and configured to set the second parameter based on the second original digital signal obtained when the first reference voltage is selected by the analog processing part and the second original digital signal obtained when the second reference voltage is selected by the analog processing part; and an error determination part configured to output a predetermined error determination signal based on the first corrected digital signal and the second corrected digital signal.

As a specific example, the error determination signal is output based on the error determination part, and a comparison result between a magnitude of a difference between the first corrected digital signal and the second corrected digital signal and a predetermined threshold value.

BRIEF DESCRIPTION OF DRAWINGS

FIG. 9 is an explanatory diagram of a method for setting parameters for the filter according to the first embodiment of the present disclosure.

FIG. 10 is an explanatory diagram of another method for setting parameters for the filter according to the first embodiment of the present disclosure.

DETAILED DESCRIPTION

Figure 1:
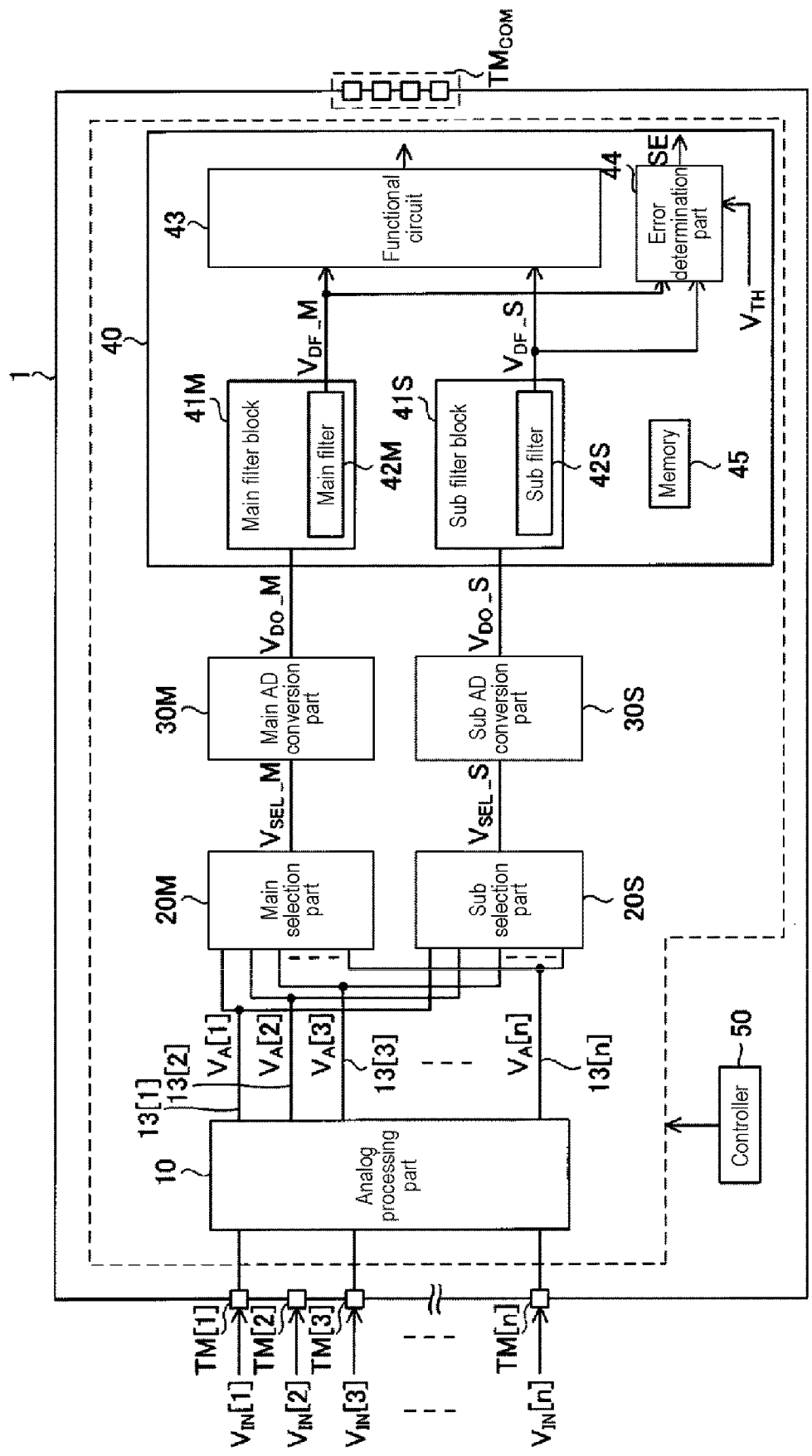
FIG. 1 is an overall configuration diagram of an AD converter according to a first embodiment of the present disclosure.

Exemplary embodiments of the present disclosure will be now described in detail with reference to the drawings. In each of the drawings to be referred to, like parts are denoted by like reference numerals and a repeated description thereof will be omitted in principle. Further, in the present disclosure, for the simplification of description, names of information, signals, physical quantities, elements, members, or the like corresponding to reference symbols or numerals may be omitted or abbreviated by specifying the reference symbols or numerals referring to the information, signals, physical quantities, elements, members, or the like. For example, a main AD conversion part (see FIG. 1) referred to by "30M," which will be described later, may be expressed as a main AD conversion part 30M or may be abbreviated as an AD conversion part 30M or a conversion part 30M, but they all refer to the same one.

First, some terms used in the description of the present embodiment will be described. In the present embodiment, the term "AD" is an abbreviation for analog-digital conversion. The term "ground" may refer to a conductive part having a reference potential of zero volt (0 V) or to the reference potential itself. In each embodiment, a voltage indicated without a specific reference may indicate a potential viewed from the ground.

First Embodiment

A first embodiment of the present disclosure will be described. FIG. 1 is an overall configuration diagram of an AD converter 1 according to the first embodiment of the present disclosure. The AD converter 1 includes an analog processing part 10, a digital processing part 40, and a controller 50, in addition to a plurality of terminals including input terminals TM[1] to TM[n] and a communication terminal $TM_{COM}$, and further includes a plurality of AD conversion blocks each having a selection part and an AD conversion part, where n is an arbitrary integer of 2 or more.

Specifically, the AD converter 1 includes two AD conversion blocks, which includes a main AD conversion block and a sub AD conversion block. The main AD conversion block includes a main selection part 20M and a main AD conversion part 30M as a first selection part and a first AD conversion part, respectively. The sub AD conversion block includes a sub selection part 20S and a sub AD conversion part 30S as a second selection part and a second AD conversion part, respectively.

The digital processing part 40 includes as many filter blocks as the number of AD conversion blocks. Since it is assumed here that the number of AD conversion blocks is two, the digital processing part 40 includes two filter blocks, which are configured by a main filter block 41M (first filter block) connected to the main AD conversion part 30M and a sub filter block 41S (second filter block) connected to the sub AD conversion part 30S. Each filter block has a filter for filtering a digital signal output from the corresponding AD conversion part. This filtering includes a function of correcting a gain error and an offset error, which will be described later. Specifically, the main filter block 41M has a main filter 42M (first filter), and the sub filter block 41S has a sub filter 42S (second filter). The digital processing part 40 further includes a functional circuit 43, an error determination part 44, and a memory 45 configured by a random access memory (RAM) or the like. The memory 45 may be a storage circuit classified as a register. The memory 45 may be installed in the functional circuit 43.

The controller 50 controls operations of the respective parts installed in the AD converter 1 (excluding an operation of the controller 50), details of which will be apparent from the following description. Further, it may be considered that the function of the controller 50 is realized by the digital processing part 40.

Figure 2:
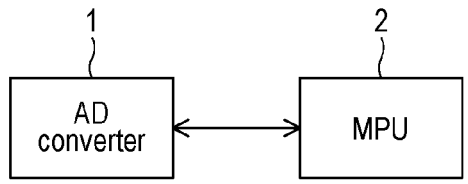
FIG. 2 is a diagram illustrating a connection between the AD converter and an MPU according to the first embodiment of the present disclosure.

As illustrated in FIG. 2, a micro processing unit (MPU) 2 is connected to the AD converter 1. It is assumed here that signals can be transmitted and received by a serial peripheral interface (SPI) communication between the AD converter 1 and the MPU 2 via the communication terminal $TM_{COM}$, but the communication method is not limited to the SPI.

The AD converter 1 has a function of performing analog-digital conversion (i.e., AD conversion) on measurement target voltages which are analog voltages. Measurement target voltages for n channels can be input to the AD converter 1, which can individually AD-convert the measurement target voltages for n channels. The n channels consist of first to n-th channels, and a measurement target voltage for an i-th channel will be referred to by reference symbol "$V_{IN}[i]$", where i is an arbitrary integer of 1 or more and n or less. The measurement target voltage $V_{IN}[i]$ can be input to an input terminal TM[i]. The measurement target voltage may not be input to any one or more of the input terminals TM[1] to TM[n], but it is assumed here that measurement target voltages $V_{IN}[1]$ to $V_{IN}[n]$ are respectively input to the input terminals TM[1] to TM[n].

The analog processing part 10 selects one of the measurement target voltages and a plurality of predetermined reference voltages for each channel, and outputs an analog voltage signal corresponding to the selected voltage. The analog voltage signal output from the analog processing part 10 and corresponding to the i-th channel will be referred to by reference symbol "$V_A[i]$." N analog wirings 13[1] to 13[n] are installed at the output side of the analog processing part 10, where the analog voltage signal $V_A[i]$ is applied to an analog wiring 13[i].

Figure 3:
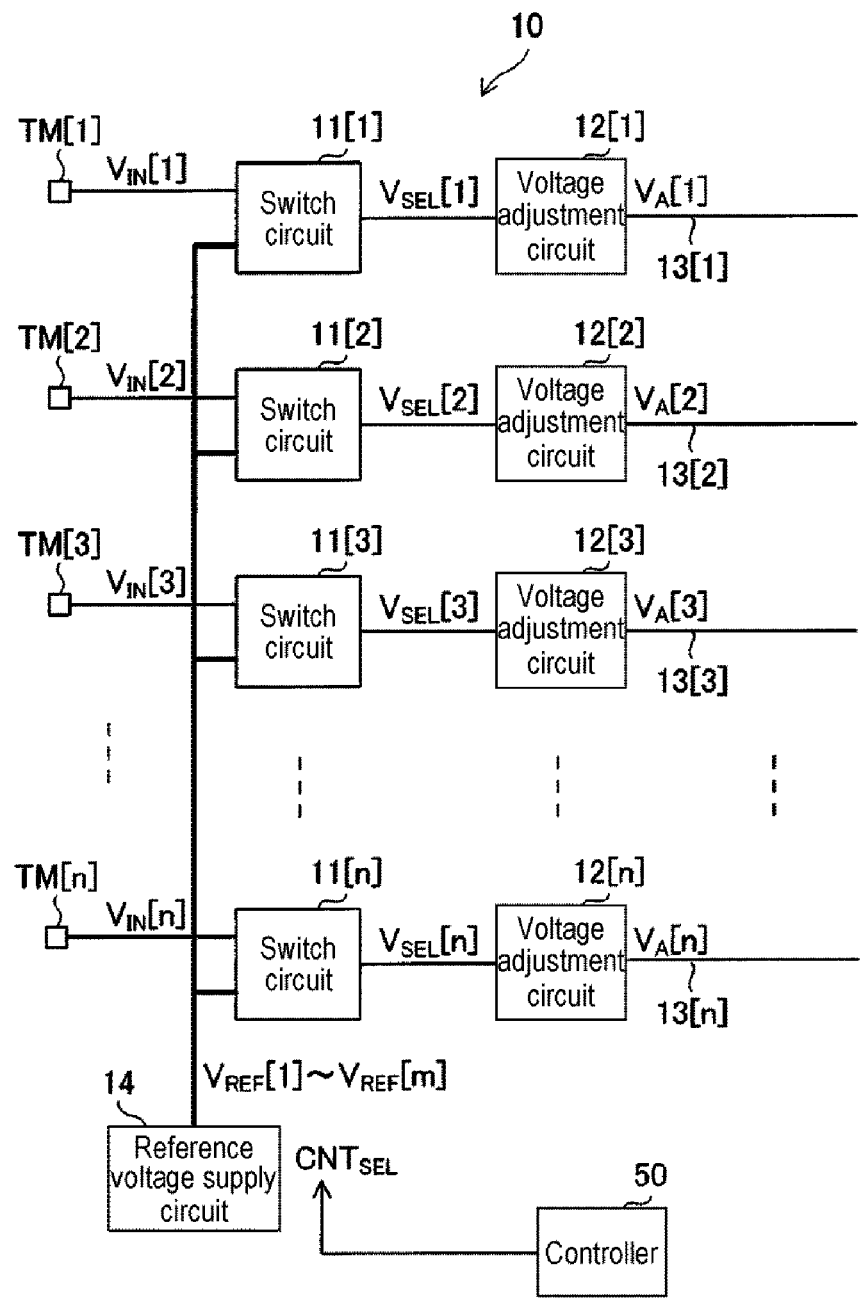
FIG. 3 is a diagram illustrating a configuration example of an analog processing part in FIG. 1 according to the first embodiment of the present disclosure.

FIG. 3 illustrates an internal configuration of the analog processing part 10. The analog processing part 10 includes switch circuits 11[1] to 11[n] for n channels, voltage adjustment circuits 12[1] to 12[n] for n channels, analog wirings 13[1] to 13[n] for n channels, and a reference voltage supply circuit 14. The switch circuits 11[1] to 11[n] are connected to the input terminals TM[1] to TM[n], respectively, and receive the measurement target voltages $V_{IN}[1]$ to $V_{IN}[n]$. The reference voltage supply circuit 14 generates m types of reference voltages $V_{REF}[1]$ to $V_{REF}[m]$ and applies the reference voltages $V_{REF}[1]$ to $V_{REF}[m]$ to the switch circuits 11[1] to 11[n], respectively, where m is an arbitrary integer of 2 or more. The reference voltages $V_{REF}[1]$ to $V_{REF}[m]$ are DC voltages having different predetermined voltage values. For example, the reference voltages $V_{REF}[1]$ and $V_{REF}[2]$ are respectively 0.5 V and 1.0 V. Each switch circuit is configured by a plurality of switches, each of which consists of one or more transistors such as a metal-oxide-semiconductor field-effect transistor (MOSFET) or the like.

Since the functions of the switch circuits and the voltage adjustment circuits are common among the first to n-th channels, the operations of the switch circuits and the voltage adjustment circuits will be described by focusing on the i-th channel. In the i-th channel, the switch circuit 11[i] selects one voltage from the measurement target voltage Vm[i] and the reference voltages $V_{REF}[1]$ to $V_{REF}[m]$ and sends the selected voltage as a voltage $V_{SEL}[i]$ to the voltage adjustment circuit 12[i]. The voltage adjustment circuit 12[i] adjusts the selected voltage $V_{SEL}[i]$ from the switch circuit 11[i] to output an analog voltage signal $V_A[i]$ corresponding to the selected voltage $V_{SEL}[i]$ to the analog wiring 13[i].

The controller 50 controls and specifies selected contents in the switch circuits 11[1] to 11[n] by outputting a control signal $CNT_{SEL}$ to the switch circuits 11[1] to 11[n]. That is, the controller 50 controls which voltage among the measurement target voltage $V_A[i]$ and the reference voltages $V_{REF}[1]$ to $V_{REF}[m]$ is selected by the switch circuit 11[i] through the output of the control signal $CNT_{SEL}$. The controller 50 may individually control the selected contents in the switch circuits 11[1] to 11[n], but in the following description, it is assumed that the common control signal $CNT_{SEL}$ is applied to the switch circuits 11[1] to 11[n] so that common selection is performed in the switch circuits 11[1] to 11[n] unless otherwise specified.

In the voltage adjustment circuit 12[i], the analog voltage signal $V_A[i]$ is obtained by, for example, dividing the selected voltage $V_{SEL}[i]$. At this time, the voltage division ratios among the voltage adjustment circuits 12[1] to 12[n] may be equal or may not be equal to one another. Alternatively, in the case where the measurement target voltage Vm[i] is assumed to be relatively small, the analog voltage signal $V_A[i]$ may be obtained by amplifying the selected voltage $V_{SEL}[i]$ in the voltage adjustment circuit 12[i]. Furthermore, the voltage division and amplification described above are not essential, and the voltage adjustment circuit 12[i] may be omitted. In this case, the selected voltage $V_{SEL}[i]$ itself becomes the analog voltage signal $V_A[i]$.

As illustrated in FIG. 1, the selection parts 20M and 20S are connected to the analog wirings 13[1] to 13[n], respectively, so that the analog voltage signals $V_A[1]$ to $V_A[n]$ are input to the selection parts 20M and 20S, respectively. Each of the selection parts 20M and 20S selects one of the analog voltage signals $V_A[1]$ to $V_A[n]$ to output the selected analog voltage signal. The analog voltage signals selected by the selection parts 20M and 20S will be referred to by reference symbols "$V_{SEL}\_M$" and "$V_{SEL}\_S$," respectively.

Figure 4:
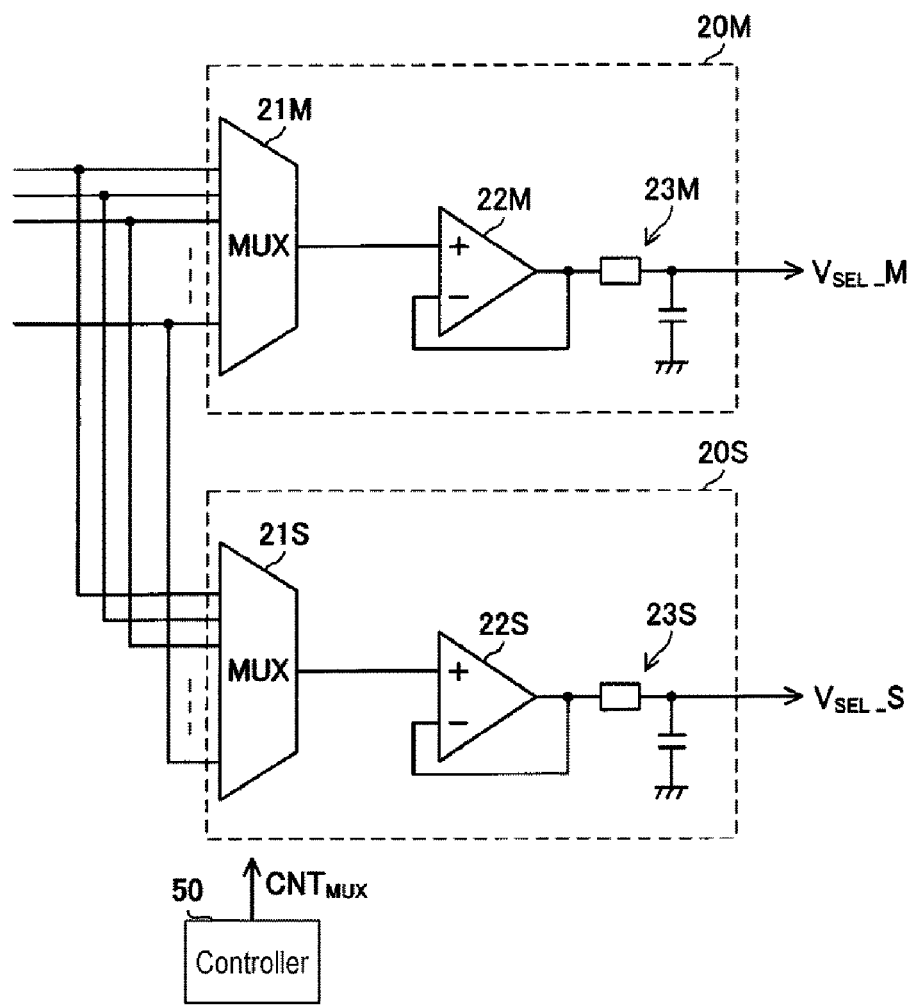
FIG. 4 is a diagram illustrating a configuration example of a main selection part and a sub selection part in FIG. 1 according to the first embodiment of the present disclosure.

FIG. 4 illustrates a configuration example of the selection parts 20M and 20S. The selection part 20M in FIG. 4 is configured by an n-input 1-output multiplexer 21M for selecting one of the analog voltage signals $V_A[1]$ to $V_A[n]$ to output the selected signal, an amplification circuit (voltage follower) 22M for performing impedance transformation on an output signal of the multiplexer 21M, and a low-pass filter 23M for reducing high frequency component of the output signal of the multiplexer 21M after the impedance transformation, where the output signal of the multiplexer 21M after the impedance transformation and the high frequency component reduction is output as the selected analog voltage signal $V_{SEL}\_M$. The selection parts 20M and 20S have the same configuration. That is, specifically, the selection part 20S in FIG. 4 is configured by an n-input 1-output multiplexer 21S for selecting one of the analog voltage signals $V_A[1]$ to $V_A[n]$ to output the selected signal, an amplification circuit (voltage follower) 22S for performing impedance transformation on an output signal of the multiplexer 21S, and a low-pass filter 23S for reducing high frequency component of the output signal of the multiplexer 21S after the impedance transformation, where the output signal of the multiplexer 21S after the impedance transformation and the high frequency component reduction is output as the selected analog voltage signal $V_{SEL\_}S$.

The controller 50 controls and specifies selected contents in the multiplexers 21M and 21S by outputting a control signal $CNT_{MUX}$ to the multiplexers 21M and 21S. That is, the controller 50 controls which voltage signals among the analog voltage signals $V_A[1]$ to $V_A[n]$ are selected by the multiplexers 21M and 21S through the output of the control signal $CNT_{MUX}$. At this time, the controller 50 controls the multiplexers 21M and 21S so that the same analog voltage signals are selected by the multiplexers 21M and 21S. That is, the controller 50 controls the multiplexers 21M and 21S, for example, so that the analog voltage signal $V_A[1]$ is also selected by the multiplexer 21S when the analog voltage signal $V_A[1]$ is selected by the multiplexer 21M and so that the analog voltage signal $V_A[^2]$ is also selected by the multiplexer 21S when the analog voltage signal $V_A[^2]$ is selected by the multiplexer 21M.

Referring back to FIG. 1, the AD conversion part 30M performs analog-digital conversion (AD conversion) on the selected analog voltage signal $V_{SEL\_}M$ from the selection part 20M to generate a digital signal $V_{DO\_}M$. The AD conversion part 30S performs AD conversion (analog-digital conversion) on the selected analog voltage signal $V_{SEL\_}S$ from the selection part 20S to generate a digital signal $V_{DO\_}S$. The digital signal $V_{DO\_}M$ has a digital value indicative of a voltage value of the voltage signal $V_{SEL\_}M$, and the digital signal $V_{DO\_}S$ has a digital value indicative of a voltage value of the voltage signal $V_{SEL\_}S$. Each of the conversion parts 30M and 30S may periodically perform AD conversion at a predetermined sampling period. The timing of AD conversion in the conversion parts 30M and 30S may be controlled by the controller 50.

Figure 5:
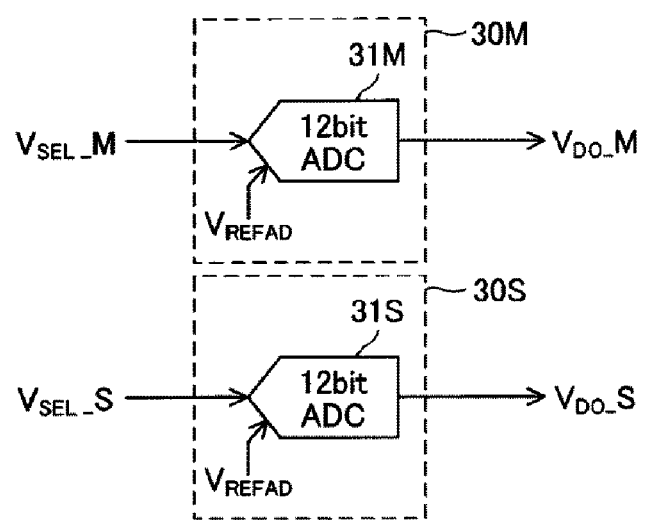
FIG. 5 is a diagram illustrating a configuration example of a main AD conversion part and a sub AD conversion part in FIG. 1 according to the first embodiment of the present disclosure.

FIG. 5 illustrates a configuration example of the AD conversion parts 30M and 30S. In FIG. 5, the AD conversion part 30M is configured by a successive approximation type AD converter 31M, and the AD conversion part 30S is configured by a successive approximation type AD converter 31S. An example of the resolution of the AD converters 31M and 31S is 12 bits, but may be other than 12 bits. Each of the AD converters 31M and 31S realizes the successive approximation type AD conversion using a predetermined reference voltage $V_{REFAD}$. The reference voltage $V_{REFAD}$, which is a voltage different from the reference voltage generated by the reference voltage supply circuit 14, is generated by a reference voltage generation circuit (not shown) installed separately from the reference voltage supply circuit 14 (details of which will be described later). The AD conversion method in the AD converters 31M and 31S is not limited to the successive approximation type, but may be, for example, a flash type, a pipeline type, or a ΔΧ type.

The digital processing part 40 receives the digital signals $V_{DO\_}M$ and $V_{DO\_}S$. In the digital processing part 40, the main filter 42M performs filtering on the digital signal $V_{DO\_}M$ based on a main filter parameter (first parameter) to generate a digital signal $V_{DF\_}M$, and the sub filter 42S performs filtering on the digital signal $V_{DO\_}S$ based on a sub filter parameter (second parameter) to generate a digital signal $V_{DF\_}S$. As described above, this filtering includes a function of correcting a gain error and an offset error.

Various errors may be mixed in the process of obtaining the digital signal $V_{DO\_}M$ from the measurement target voltage $V_{IN}[i]$. For example, in that process, an offset error and a gain error may be mixed in the selection part 20M, and an offset error and a gain error may be mixed in the AD conversion part 30M. In the main filter 42M, correction for removing (in other words, reducing) these errors is performed on the digital signal $V_{DO\_}M$, and the corrected digital signal $V_{DO\_}M$ is output as the digital signal $V_{DF\_}M$ from the main filter 42M. The corrected contents in the main filter 42M are determined based on the main filter parameter. In the main filter block 41M, the main filter parameter suitable for removing errors that may be mixed in the selection part 20M, the AD conversion part 30M and the like, is set.

Similarly, various errors may be mixed in the process of obtaining the digital signal $V_{DO\_}S$ from the measurement target voltage $V_{IN}[i]$. For example, in that process, an offset error and a gain error may be mixed in the selection part 20S and an offset error and a gain error may be mixed in the AD conversion part 30S. In the sub filter 42S, correction for removing (in other words, reducing) these errors is performed on the digital signal $V_{DO\_}S$, and the corrected digital signal $V_{DO\_}S$ is output as the digital signal $V_{DF\_}S$ from the sub filter 42S. The corrected contents in the sub filter 42S are determined based on the sub filter parameter. In the sub filter block 41S, the sub filter parameter suitable for removing errors that may be mixed in the selection part 20S, the AD conversion part 30S and the like, is set.

In the following description, in order to clearly distinguish the digital signals before correction from the digital signals after correction (in other words, in order to clearly distinguish the digital signals before filtering from the digital signals after filtering), the digital signals $V_{DO\_}M$ and $V_{DO\_}S$, which are the digital signals before correction, may be referred to as original digital signals, and digital signals $V_{DF\_}M$ and $V_{DF\_}S$, which are the digital signals after correction, may be referred to as corrected digital signals. The filtering in the filters 42M and 42S may further include a function other than the aforementioned correction (for example, a function of a low-pass filter).

The functional circuit 43 executes a predetermined process based on the corrected digital signals $V_{DF\_}M$ and $V_{DF\_}S$. For example, the functional circuit 43 outputs the corrected digital signal $V_{DF\_}M$ to the MPU 2 via the communication terminal $TM_{COM}$. The functional circuit 43 may output at least one of the corrected digital signals $V_{DF\_}M$ and $V_{DF\_}S$ to the MPU 2 via the communication terminal $TM_{COM}$, or may output an intermediate signal of the corrected digital signals $V_{DF\_}M$ and $V_{DF\_}S$ to the MPU 2 via the communication terminal $TM_{COM}$. Also, for example the functional circuit 43 may be configured to determine whether or not the voltage value indicated by the corrected digital signal $V_{DF\_}M$ or $V_{DF\_}S$ falls within a predetermined normal range, and output a signal corresponding to the determination result to the MPU 2 via the communication terminal $TM_{COM}$. Furthermore, the signal output from the AD converter 1 to the MPU 2 is performed through a communication IF circuit (not shown).

The error determination part 44 determines validity of the operation of the circuit for obtaining the corrected digital signal $V_{DF\_}M$ or $V_{DF\_}S$ based on the corrected digital signals $V_{DF\_}M$ and $V_{DF\_}S$ to output a predetermined error determination signal SE indicative of the determination result. The error determination signal SE may be output to the MPU 2 via the communication terminal $TM_{COM}$.

As described above, the multiplexers 21M and 21S are controlled so that the same analog voltage signals are selected by the multiplexers 21M and 21S. Therefore, when an abnormality (including excessive deterioration) does not occur in the AD converter 1, the voltage values indicated by the corrected digital signal $V_{DF\_}M$ or $V_{DF\_}S$ are completely equal, or even if there is a difference between them, it is expected to be considerably small. In consideration of this, the error determination part 44 compares a magnitude of the difference |$V_{DIF}$| between the corrected digital signals $V_{DF}\_M$ and $V_{DF}\_S$ with a predetermined threshold $V_{TH}$, and if the magnitude of the difference |$V_{DIF}$| is larger than the threshold $V_{TH}$, an error determination signal SE of "1" is output, and if the magnitude of the difference |$V_{DIF}$| is equal to or less than the threshold value $V_{TH}$, an error determination signal SE of "0" is output. The error determination signal SE of "1" indicates that the operation of the circuit for obtaining the corrected digital signal $V_{DF}\_M$ or $V_{DF}\_S$ is not valid (i.e., an abnormality occurs in the operation of the circuit). When a state in which the magnitude of the difference $V_{DIF}$ is larger than the threshold value $V_{TH}$ is detected, the value of the error determination signal SE may be latched at "1" until a predetermined release condition is satisfied.

The difference between the corrected digital signals $V_{DF}\_M$ and $V_{DF}\_S$ indicates a difference between the voltage value indicated by the corrected digital signal $V_{DF}\_M$ and the voltage value indicated by the corrected digital signal $V_{DF}\_S$. The threshold value $V_{TH}$ is a value (e.g., 4 or 16 in decimal notation) indicative of an allowable range of the difference in the digital domain. The threshold value $V_{TH}$ may be a value set so as not to be changed using a one time programmable read-only-memory (OPROM) or the like. Alternatively, the digital processing part 40 may variably set the threshold value $V_{TH}$ based on a threshold value setting signal received from the MPU 2 through the SPI communication.

Next, a possible state of the AD converter 1 will be described. The state of the AD converter 1 may be an actual measurement state or a calibration state for each channel under the control of the controller 50.

[Actual Measurement State and Actual Measurement AD Conversion Operation]

Figure 6:
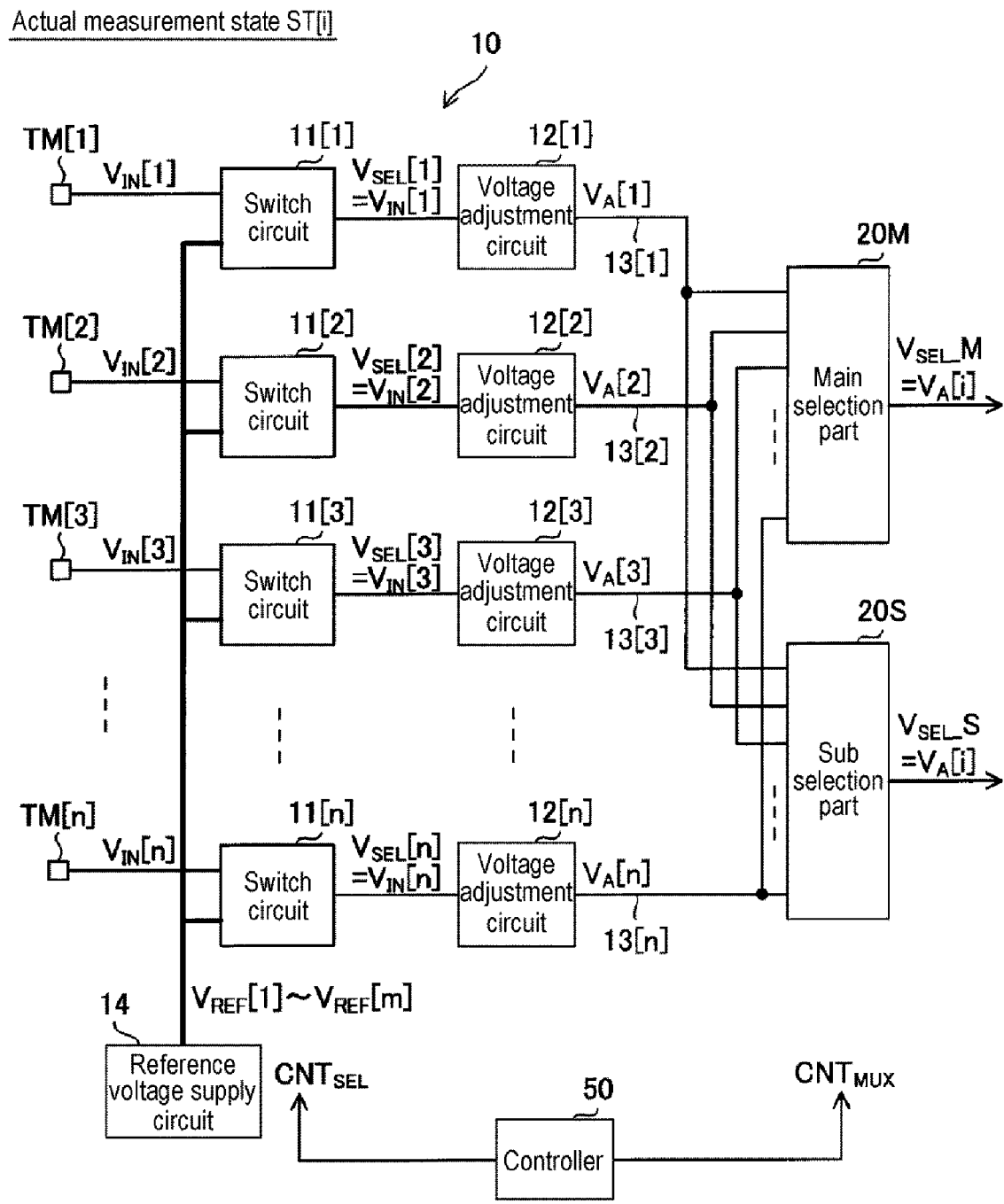
FIG. 6 is a diagram illustrating an actual measurement state which is an example of a possible state of the AD converter, according to the first embodiment of the present disclosure.

FIG. 6 illustrates states of voltages of the respective parts in an actual measurement state. In the actual measurement state, first, the switch circuits 11[1] to 11[n] are controlled so that the measurement target voltages VI[1] to $V_{IN}$[n] are respectively selected as the voltages $V_{SEL}$[1] to $V_{SEL}$[n]. Then, the actual measurement state is subdivided into actual measurement states ST[1] to ST[n]. The actual measurement states ST[1] to ST[n] correspond to actual measurement states for the first to n-th channels, respectively. An actual measurement state ST[i] is a state for AD conversion of the measurement target voltage $V_{IN}$[i]. Therefore, in the actual measurement state ST[i], the selection parts 20M and 20S are controlled so that the analog voltage signal $V_A$[i], among the analog voltage signals $V_A$[l] to $V_A$[n], is selected as the signals $V_{SEL}\_M$ and $V_{SEL}\_S$.

That is, for example, in the actual measurement state ST[1] for the first channel, the switch circuit 11[1] and the selection parts 20M and 20S are controlled so that the measurement target voltage $V_{IN}$[1] is selected by the switch circuit 11[1], and the analog voltage signal $V_A$[l] corresponding to the measurement target voltage $V_{IN}$[1] is selected as the signals $V_{SEL}\_M$ and $V_{SEL}\_S$. Similarly, for example, in the actual measurement state ST[2] for the second channel, the switch circuit 11[2] and the selection parts 20M and 20S are controlled so that the measurement target voltage $V_{IN}$[2] is selected by the switch circuit 11[2], and the analog voltage signal $V_A$ corresponding to the measurement target voltage $V_{IN}$[2] is selected as the signals $V_{SEL}\_M$ and $V_{SEL}\_S$. The same applies to actual measurement states for other channels.

The operation of performing AD conversion by the conversion parts 30M and 30S in the actual measurement state will be referred to as an actual measurement AD conversion operation. The analog voltage signal $V_A$[1] corresponding to the measurement target voltage $V_{IN}$[1] may be AD-converted by the actual measurement AD conversion operation in the actual measurement state ST[1] to obtain the digital signals $V_{DO}\_M$, $V_{DF}\_M$, $V_{DO}\_S$, and $V_{DF}\_S$ corresponding to the measurement target voltage $V_{IN}$[1]. The analog voltage signal $V_A$[2] corresponding to the measurement target voltage $V_{IN}$[2] may be AD-converted by the actual measurement AD conversion operation in the actual measurement state ST[2] to obtain the digital signals $V_{DO}\_M$, $V_{DF}\_M$, $V_{DO}\_S$, and $V_{DF}\_S$ corresponding to the measurement target voltage $V_{IN}$[2]. The same applies to the actual measurement AD conversion operations in other actual measurement states.

[Calibration State and Calibration AD Conversion Operation]

Figure 7:
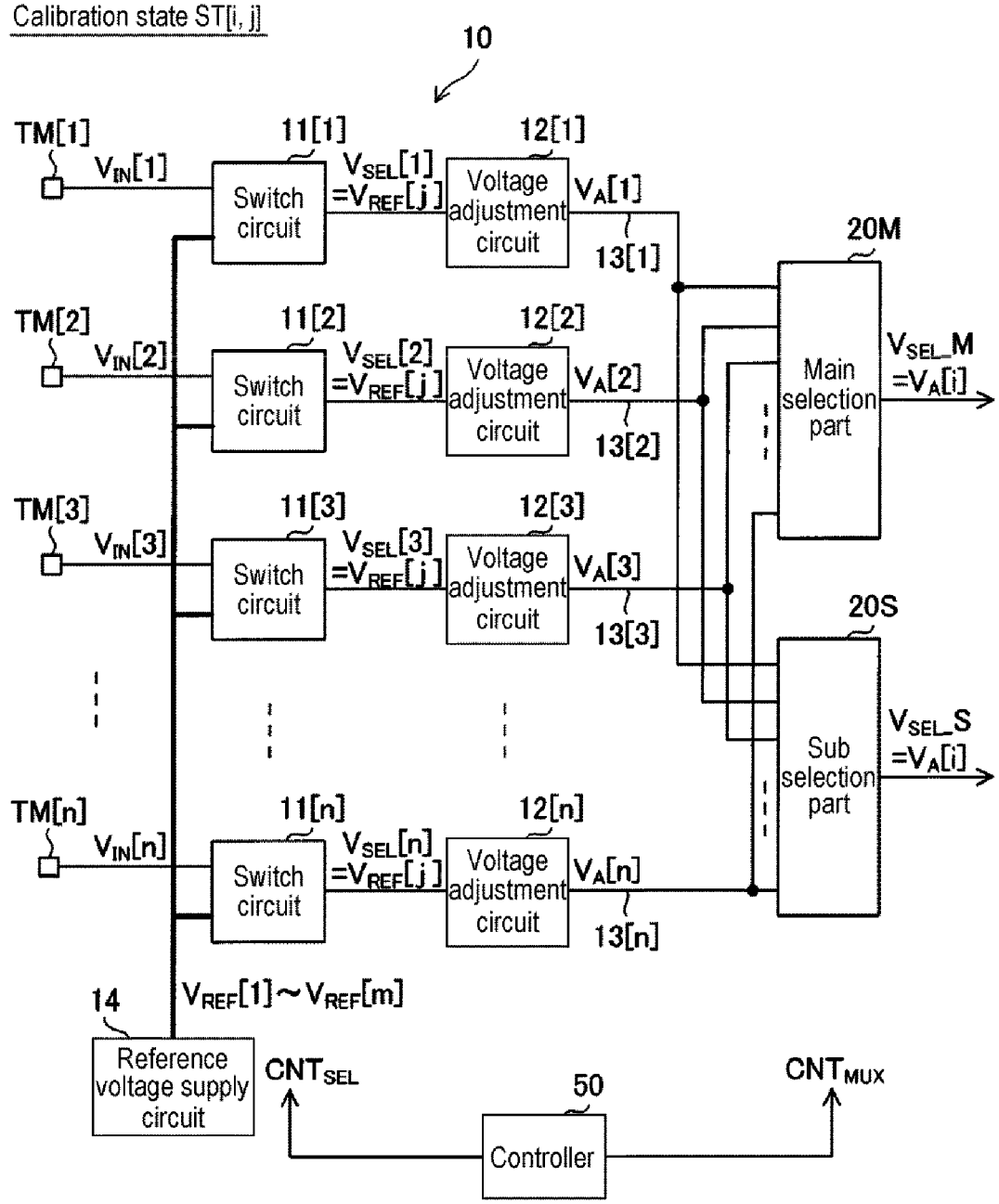
FIG. 7 is a diagram illustrating a calibration state which is an example of a possible state of the AD converter, according to the first embodiment of the present disclosure.

FIG. 7 illustrates states of voltages of the respective parts in a calibration state. The calibration state is subdivided into n×m types of calibration states, and one of the n×m types of calibration states will be referred to as reference symbol "ST[i, j]." In the reference symbol "ST[i, j]," the variable i takes an integer of 1 or more and n or less and the variable j takes an integer of 1 or more and m or less. In the calibration state ST[i, j], the switch circuits 11[1] to 11[n] are controlled so that the reference voltage $V_{REF}$[j] is selected as the voltages $V_{SEL}$[1] to $V_{SEL}$[n]. Therefore, for example, the switch circuits 11[1] to 11[n] are controlled so that the reference voltage $V_{REF}$[1] is selected as the voltages $V_{SEL}$[1] to $V_{SEL}$[n] in the calibration state ST[i, 1] and so that the reference voltage $V_{REF}$[2] is selected as the voltages $V_{SEL}$[1] to $V_{SEL}$[n] in the calibration state ST[i, 2].

The calibration states ST[1, j] to ST[n, j] correspond to calibration states for the first to n-th channels, respectively. In the calibration state ST[i, j], the selection parts 20M and 20S are controlled so that the analog voltage signal $V_A$[i], among the analog voltage signals $V_A$[1] to $V_A$[n], is selected as the signals $V_{SEL}\_M$ and $V_{SEL}\_S$.

That is, for example, when focusing on the first channel, the switch circuit 11[1] and the selection parts 20M and 20S are controlled so that the reference voltage $V_{REF}$[1] is selected by the switch circuit 11[1] in the calibration state ST[1, 1] for the first channel, which is one of the calibration states, and the analog voltage signal $V_A$[1] corresponding to the reference voltage $V_{REF}$[1] is selected as the signals $V_{SEL}\_M$ and $V_{SEL}\_S$. The switch circuit 11[1] and the selection parts 20M and 20S are controlled so that the reference voltage $V_{REF}$[2] is selected by the switch circuit 11[1] in the calibration state ST[1, 2] for the first channel, which is another one of the calibration states, and the analog voltage signal $V_A$[1] corresponding to the reference voltage $V_{REF}$[2] is selected as the signals $V_{SEL}\_M$ and $V_{SEL}\_S$.

Similarly, for example, when focusing on the second channel, the switch circuit 11[2] and the selection parts 20M and 20S are controlled so that the reference voltage $V_{REF}$[1] is set by the switch circuit 11[2] in the calibration state ST[2, 1] for the second channel, which is one of the calibration states, and the analog voltage signal $V_A$[2] corresponding to the reference voltage $V_{REF}$[1] is selected as the signals $V_{SEL}\_M$ and $V_{SEL}\_S$. The switch circuit 11[2] and the selection parts 20M and 20S are controlled so that the reference voltage $V_{REF}$[2] is selected by the switch circuit 11[2] in the calibration state ST[2, 2] for the second channel, which is another one of the calibration states, and the analog voltage signal $V_A$[2] corresponding to the reference voltage $V_{REF}$[$^2$] is selected as the signals $V_{SEL}\_M$ and $V_{SEL}\_S$.

The same applies to other channels, and the same applies to when a reference voltage other than the reference voltages $V_{REF}[1]$ and $V_{REF}[2]$ is selected.

An operation in which AD conversion is performed by the conversion parts 30M and 30S in the calibration state will be referred to as a calibration AD conversion operation.

The analog voltage signal $V_A[11]$ corresponding to the reference voltage $V_{REF}[1]$ from the switch circuit 11[1] may be AD-converted by the calibration AD conversion operation in the calibration state ST[1, 1] to obtain the digital signals $V_{DO\_M}$, $V_{DF\_M}$, $V_{DO\_S}$, and $V_{DF\_S}$ corresponding to the reference voltage $V_{REF}[1]$ from the switch circuit 11[1].

The analog voltage signal $V_A[11]$ corresponding to the reference voltage $V_{REF}[2]$ from the switch circuit 11[1] may be AD-converted by the calibration AD conversion operation in the calibration state ST[1, 2] to obtain the digital signals $V_{DO\_M}$, $V_{DF\_M}$, $V_{DO\_S}$, and $V_{DF\_S}$ corresponding to the reference voltage $V_{REF}[2]$ from the switch circuit 11[1].

The analog voltage signal $V_A[2]$ corresponding to the reference voltage $V_{REF}[1]$ from the switch circuit 11[2] may be AD-converted by the calibration AD conversion operation in the calibration state ST[2, 1] to obtain the digital signals $V_{DO\_M}$, $V_{DF\_M}$, $V_{DO\_S}$, and $V_{DF\_S}$ corresponding to the reference voltage $V_{REF}[1]$ from the switch circuit 11[2].

The analog voltage signal $V_A[2]$ corresponding to the reference voltage $V_{REF}[2]$ from the switch circuit 11[2] may be AD-converted by the calibration AD conversion operation in the calibration state ST[2, 2] to obtain the digital signals $V_{DO\_M}$, $V_{DF\_M}$, $V_{DO\_S}$, and $V_{DF\_S}$ corresponding to the reference voltage $V_{REF}[2]$ from the switch circuit 11[2].

The same applies to the calibration AD conversion operations in other calibration states.

For example, a calibration state ST[i, 1] in which the reference voltage $V_{REF}[1]$ is selected and a calibration state ST[i, 2] in which the reference voltage $V_{REF}[2]$ is selected will be referred to as a first calibration state and a second calibration state, respectively, and the AD conversion operations in the first calibration state and the second calibration state will be referred to as a first calibration AD conversion operation and a second calibration AD conversion operation, respectively.

[Parameter Setting Method]

The main filter parameter and the sub filter parameter are set based on the digital signals that can be obtained by the calibration AD conversion operations. For the sake of specific description, the setting method will be described on the assumption that the analog voltage signal $V_A[1]$ is selected by the selection parts 20M and 20S by focusing on the first channel.

Figure 8:
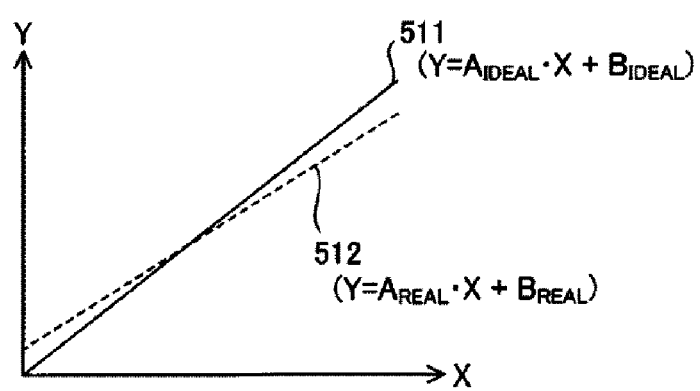
FIG. 8 is a diagram illustrating a function of a filter according to the first embodiment of the present disclosure.

The analog voltage signal $V_A[1]$ corresponding to the measurement target voltage $V_{IN}[1]$ may be AD-converted by the actual measurement AD conversion operation in the actual measurement state ST[1] to obtain the original digital signal $V_{DO\_M}$ corresponding to the measurement target voltage $V_{IN}[1]$ from the main AD conversion part 30M. However, although a voltage value Y indicated by the original digital signal $V_{DO\_M}$ is expressed by the following equation: "$Y=A_{IDEAL} \cdot X + B_{IDEAL}$," if there is no gain error and offset error, it may be actually expressed by the following equation: "$Y=A_{REAL} \cdot X + B_{REAL}$." In FIG. 8, the solid line indicates a relationship of the former equation and the broken line indicates a relationship of the latter equation. In the aforementioned equations, "X" indicates a voltage value of the measurement target voltage $V_{IN}[1]$, and "$B_{IDEAL}$" is normally zero.

When the original digital signal $V_{DO\_M}$ is obtained by the actual measurement AD conversion operation in the actual measurement state ST[1], ideally, the voltage value Y indicated by the original digital signal $V_{DO\_M}$ becomes a value obtained by multiplying the voltage value of the measurement target voltage $V_{IN}[1]$ by a predetermined gain $A_{IDEAL}$ determined in the design stage. In practice, however, in the process of obtaining the original digital signal $V_{DO\_M}$ by the actual measurement AD conversion operation in the actual measurement state ST[1], an offset error and a gain error may be mixed in the selection part 20M, and an offset error and a gain error may be mixed in the AD conversion part 30M. Furthermore, an offset error and a gain error may be mixed even in the voltage adjustment circuit 12[1] depending on a configuration of the voltage adjustment circuit 12[1]. When a gain error exists, "$A_{REAL}$" and "$A_{IDEAL}$" do not coincide, and when an offset error exists, "$B_{REAL}$" and "$B_{IDEAL}$" do not coincide.

However, after selecting a predetermined reference voltage as the voltage $V_{SEL}[1]$, an operation of obtaining the original digital signal $V_{DO\_M}$ is executed twice or more, and the values of "$A_{REAL}$" and "$B_{REAL}$" may be obtained by referring to the original digital signal $V_{DO\_M}$ obtained by these operations, and if the main filter parameter is set based on the result, the voltage value indicated by the corrected digital signal $V_{DF\_M}$ may coincide with the voltage value Y expressed by the equation "$Y=A_{IDEAL} \cdot X + B_{IDEAL}$."

Specifically, for example, the operations may be performed as follows. The digital processing part 40 and the controller 50 cooperate to acquire the original digital signal $V_{DO\_M}$ corresponding to the reference voltage $V_{REF}[1]$ by performing the calibration AD conversion operation in the calibration state ST[1, 1] and to acquire the original digital signal $V_{DO\_M}$ corresponding to the reference voltage $V_{REF}[2]$ by performing the calibration AD conversion operation in the calibration state ST[1, 2]. Then, based on the acquired two original digital signals $V_{DO\_M}$, the main filter block 41M calculates and sets the main filter parameter so as to set the voltage value indicated by the corrected digital signal $V_{DF\_M}$ as the voltage value Y expressed by the equation "$Y=A_{IDEAL} \cdot X + B_{IDEAL}$."

Typically, for example, a gain correction coefficient and an offset adjustment amount may be calculated and set by, for example, including the gain correction coefficient and the offset adjustment amount in the main filter parameter. In this case, the value, which is obtained by multiplying the value of the original digital signal $V_{DO\_M}$ by the gain correction coefficient and adding the offset adjustment amount thereto, becomes the value of the corrected digital signal $V_{DF\_M}$. At this time, in order to prevent the gain correction coefficient and the offset adjustment amount from being set based on the original digital signal $V_{DO\_M}$ at the time of occurrence of an abnormality exceeding the range of the gain error and the offset error, it is desirable to set upper and lower limits to each of the gain correction coefficient and the offset adjustment amount.

The sub filter parameter is set in the same manner. That is, the digital processing part 40 and the controller 50 cooperate to acquire the original digital signal $V_{DO\_S}$ corresponding to the reference voltage $V_{REF}[1]$ by performing the calibration AD conversion operation in the calibration state ST[1, 1], and to acquire the original digital signal $V_{DO\_S}$ corresponding to the reference voltage $V_{REF}[2]$ by performing the calibration AD conversion operation in the calibration state ST[1, 2]. Then, based on the acquired two original digital signals $V_{DO\_S}$, the sub filter block 41S may calculate and set the sub filter parameter so as to set the voltage value indicated by the corrected digital signal $V_{DF\_S}$ as the voltage value Y expressed by the equation "$Y = A_{IDEAL} \cdot X + B_{IDEAL}$." The description of the gain correction coefficient and the offset adjustment amount as described above also applies to the sub filter parameter.

Although the focus was on the first channel, the same operation applies to other channels. When generalized using an integer i of 1 or more and n or less, the following operations may be performed.

The digital processing part 40 and the controller 50 cooperate to acquire the original digital signals $V_{DO\_M}$ and $V_{DO\_S}$ corresponding to the reference voltage $V_{REF}[1]$, as a first evaluation signal and a second evaluation signal, respectively, by performing the calibration AD conversion operation in the calibration state ST[i, 1], and to acquire the original digital signals $V_{DO\_M}$ and $V_{DO\_S}$ corresponding to the reference voltage $V_{REF}[2]$, as a third evaluation signal and a fourth evaluation signal, respectively, by performing the calibration AD conversion operation in the calibration state ST[i, 2]. The main filter block 41M sets the main filter parameter based on the first and third evaluation signals, and the sub filter block 41S sets the sub filter parameter based on the second and fourth evaluation signals.

The first and second evaluation signals are the original digital signals $V_{DO\_M}$ and $V_{DO\_S}$ obtained from the conversion parts 30M and 30S, respectively, when the reference voltage $V_{REF}[1]$ is selected by the switch circuit 11[i], and the analog voltage signal $V_A[i]$ corresponding to the reference voltage $V_{REF}[1]$ is selected by the selection parts 20M and 20S.

The third and fourth evaluation signals are the original digital signals $V_{DO\_M}$ and $V_{DO\_S}$ obtained from the conversion parts 30M and 30S, respectively, when the reference voltage $V_{REF}[2]$ is selected by the switch circuit 11[i], and the analog voltage signal $V_A[i]$ corresponding to the reference voltage $V_{REF}[2]$ is selected by the selection parts 20M and 20S.

[Individual Setting Method MTD1 (Parameter Setting for Each Channel)]

The main filter block 41M may set the main filter parameter for each channel, and the sub filter block 41S may set the sub filter parameter for each channel. Such a setting method will be referred to as an individual setting method MTD1. In the individual setting method MTD1, the first to fourth evaluation signals are acquired for each channel by the digital processing part 40, and the main filter block 41M sets the main filter parameter for each channel based on the first and third evaluation signals, and the sub filter block 41S sets the sub filter parameter for each channel based on the second and fourth evaluation signals. Furthermore, in this case, the corrected digital signal $V_{DF\_M}$ is generated from the original digital signal $V_{DO\_M}$ for each channel using the main filter parameter set for each channel, and the corrected digital signal $V_{DF\_S}$ is generated from the original digital signal $V_{DO\_S}$ for each channel using the sub filter parameter set for each channel. Thus, it is possible to correct even a gain error and an offset error that may be mixed in the voltage adjustment circuits 12[1] to 12[n].

More specifically, the parameters may be set and used as follows, by focusing on the first and second channels (see FIG. 9).

For the first channel, the main filter block 41M sets the main filter parameter for the first channel based on the original digital signal $V_{DO\_M}$ (i.e., the original digital signal $V_{DO\_M}$ corresponding to the reference voltage $V_{REF}[1]$ ($=V_{SEL}[1]$)) obtained by the calibration AD conversion operation in the calibration state ST[1, 1] and the original digital signal $V_{DO\_M}$ (i.e., the original digital signal $V_{DO\_M}$ corresponding to the reference voltage $V_{REF}[2]$ ($=V_{SEL}[1]$)) obtained by the calibration AD conversion operation in the calibration state ST[1, 2], and then uses the main filter parameter for the first channel for the original digital signal $V_{DO\_M}$ obtained by AD-converting the analog voltage signal $V_A[1]$ for the first channel.

For the second channel, the main filter block 41M sets the main filter parameter for the second channel based on the original digital signal $V_{DO\_M}$ (i.e., the original digital signal $V_{DO\_M}$ corresponding to the reference voltage $V_{REF}[1]$ ($=V_{SEL}[2]$)) obtained by the calibration AD conversion operation in the calibration state ST[2, 1] and the original digital signal $V_{DO\_M}$ (i.e., the original digital signal $V_{DO\_M}$ corresponding to the reference voltage $V_{REF}[2]$ ($=V_{SEL}[2]$)) obtained by the calibration AD conversion operation in the calibration state ST[2, 2], and then uses the main filter parameter for the second channel for the original digital signal $V_{DO\_M}$ obtained by AD-converting the analog voltage signal $V_A[2]$ for the second channel.

For the first channel, the sub filter block 41S sets the sub filter parameter for the first channel based on the original digital signal $V_{DO\_S}$ (i.e., the original digital signal $V_{DO\_S}$ corresponding to the reference voltage $V_{REF}[1]$ ($=V_{SEL}[1]$)) obtained by the calibration AD conversion operation in the calibration state ST[1, 1] and the original digital signal $V_{DO\_S}$ (i.e., the original digital signal $V_{DO\_S}$ corresponding to the reference voltage $V_{REF}[2]$ ($=V_{SEL}[1]$)) obtained by the calibration AD conversion operation in the calibration state ST[1, 2], and then uses the sub filter parameter for the first channel for the original digital signal $V_{DO\_S}$ obtained by AD-converting the analog voltage signal $V_A[1]$ for the first channel.

For the second channel, the sub filter block 41S sets the sub filter parameter for the second channel based on the original digital signal $V_{DO\_S}$ (i.e., the original digital signal $V_{DO\_S}$ corresponding to the reference voltage $V_{REF}[1]$ ($=V_{SEL}[2]$)) obtained by the calibration AD conversion operation in the calibration state ST[2, 1] and the original digital signal $V_{DO\_S}$ (i.e., the original digital signal $V_{DO\_S}$ corresponding to the reference voltage $V_{REF}[2]$ ($=V_{SEL}[2]$)) obtained by the calibration AD conversion operation in the calibration state ST[2, 2], and then uses the sub filter parameter for the second channel for the original digital signal $V_{DO\_S}$ obtained by AD-converting the analog voltage signal $V_A[2]$ for the second channel.

[Common Setting Method MTD2 (Common Parameter Setting among Channels)]

When there is no possibility that a gain error and an offset error are mixed in the voltage adjustment circuits 12[1] to 12[n], the main filter block 41M may set a main filter parameter common to the first to n-th channels, and the sub filter block 41S may set a sub filter parameter common to the first to n-th channels. Such a setting method will be referred to as a common setting method MTD2. In the common setting method MTD2, the first to fourth evaluation signals are acquired by the digital processing part 40 for any one representative channel, and the main filter block 41M sets a single main filter parameter based on the first and third evaluation signals and the sub filter block 41S sets a single sub filter parameter based on the second and fourth evaluation signals. After these settings, the common main filter parameter is used for all the channels when the corrected digital signal $V_{DF\_M}$ is generated from the original digital signal $V_{DO}\_M$, and the common sub filter parameter is used for all the channels when the corrected digital signal $V_{DF}\_S$ is generated from the original digital signal $V_{DO}\_S$.

More specifically, the parameters may be set and used as follows, by focusing on the first and second channels (see FIG. 10). It is assumed here that the first channel is a representative channel.

The main filter block 41M sets the main filter parameter for the representative channel (i.e., the first channel) based on the original digital signal $V_{DO}\_M$ (i.e., the original digital signal corresponding to the reference voltage $V_{REF}[1]$ (=$V_{SEL}[1]$)) obtained by the calibration AD conversion operation in the calibration state ST[1, 1] and the original digital signal $V_{DO}\_M$ (i.e., the original digital signal $V_{DO}\_M$ corresponding to the reference voltage $V_{REF}[2]$ (=$V_{SEL}[1]$)) obtained by the calibration AD conversion operation in the calibration state ST[1, 2], and also uses the main filter parameter as the main filter parameter for another channel (i.e., the second channel). That is, the common main filter parameter for the first and second channels is set based on the original digital signal $V_{DO}\_M$ obtained by the calibration AD conversion operation in the calibration state ST[1, 1] and the original digital signal $V_{DO}\_M$ obtained by the calibration AD conversion operation in the calibration state ST[1, 2]. Thereafter, the common main filter parameter is also applied to the original digital signal $V_{DO}\_M$ obtained by AD-converting the analog voltage signal $V_A A[1]$ for the first channel, and to the original digital signal $V_{DO}\_M$ obtained by AD-converting the analog voltage signal $V_A[2]$ for the second channel.

The sub filter block 41S sets the sub filter parameter for the representative channel (i.e., the first channel) based on the original digital signal $V_{DO}\_S$ (i.e., the original digital signal $V_{DO}\_S$ corresponding to the reference voltage $V_{REF}[1]$ (=$V_{SEL}[1]$)) obtained by the calibration AD conversion operation in the calibration state ST[1, 1] and the original digital signal $V_{DO}\_S$ (i.e., the original digital signal $V_{DO}\_S$ corresponding to the reference voltage $V_{REF}[2]$ (=$V_{SEL}[1]$)) obtained by the calibration AD conversion operation in the calibration state ST[1, 2], and also uses the sub filter parameter as the sub filter parameter for another channel (i.e., the second channel). That is, the common sub filter parameter for the first and second channels is set based on the original digital signal $V_{DO}\_S$ obtained by the calibration AD conversion operation in the calibration state ST[1, 1] and the original digital signal $V_{DO}\_S$ obtained by the calibration AD conversion operation in the calibration state ST[1, 2]. Thereafter, the common sub filter parameter is also applied to the original digital signal $V_{DO}\_S$ obtained by AD-converting the analog voltage signal $V_A[1]$ for the first channel, and to the original digital signal $V_{DO}\_S$ obtained by AD-converting the analog voltage signal $V_A[2]$ for the second channel.

Furthermore, although the method for setting the main parameter and the sub filter parameter using the two reference voltages $V_{REF}[1]$ and $V_{REF}[2]$ has been specifically exemplified, such setting may be realized using three or more reference voltages and the effects of reducing the gain error or the offset error may be further increased by increasing the number of types of reference voltages to be used.

Second Embodiment

A second embodiment of the present disclosure will be described. The second embodiment and third and fourth embodiments as described later are based on the first embodiment, and the description of the first embodiment, which is not particularly described in the second to fourth embodiments, also applies to the second to fourth embodiments if there is no contradiction. In interpreting the description of the second embodiment, the description of the second embodiment may be given priority for matters that are inconsistent between the first and second embodiments (the same applies to the third and fourth embodiments as described later). A plurality of arbitrary embodiments, among the first to fourth embodiments, may be combined as long as there is no contradiction.

Figure 11:
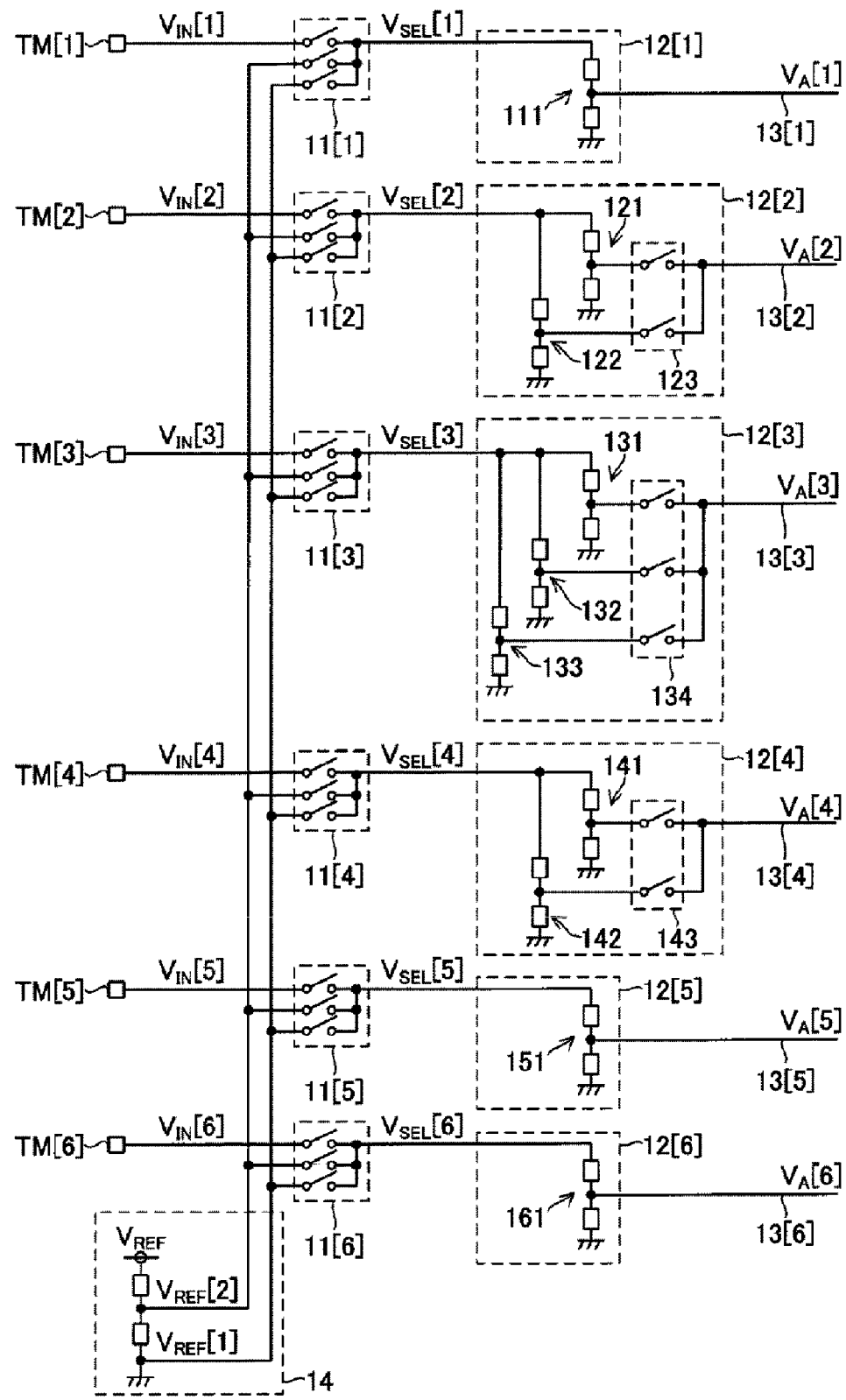
FIG. 11 is a circuit diagram of an analog processing part according to a second embodiment of the present disclosure.

FIG. 11 is a diagram illustrating a specific configuration example of the analog processing part 10 in FIG. 1. In the second embodiment, it is assumed that "n=6" and "m=2," and the analog processing part 10 has the configuration of FIG. 11. In FIG. 11, the reference voltage supply circuit 14 generates reference voltages $V_{REF}[1]$ and $V_{REF}[2]$ by dividing a predetermined positive DC voltage $V_{REF}$ using three voltage dividing resistors, where "$0<V_{REF}[1]<V_{REF}[2]$," and for example, the reference voltages $V_{REF}[1]$ and $V_{REF}[2]$ are 0.5 V and 1.0 V, respectively. The switch circuit 11[i] is configured by a plurality of switches, and selects one of the measurement target voltage $V_{IN}[i]$ and the reference voltages $V_{REF}[1]$ and $V_{REF}[2]$ to output the selected voltage as the voltage $V_{SEL}[i]$.

In FIG. 11, each of the voltage adjustment circuits 12[1] to 12[6] includes one or more voltage dividing circuits each having a plurality of voltage dividing resistors.

The voltage adjustment circuit 12[1] is configured with a voltage dividing circuit 111 for generating a divided voltage of the voltage $V_{SEL}[1]$. The divided voltage by the voltage dividing circuit 111 is applied to the analog wiring 13[1] as the analog voltage signal $V_A[1]$.

The voltage adjustment circuit 12[2] includes a voltage dividing circuit 121 for generating a divided voltage of the voltage $V_{SEL}[2]$, a voltage dividing circuit 122 for generating a divided voltage of the voltage $V_{SEL}[2]$, and a range selection part 123 for selectively outputting one of the two divided voltages obtained by the voltage dividing circuits 121 and 122 to the analog wiring 13[2] as the analog voltage signal $V_A[2]$. The voltage dividing ratios in the voltage dividing circuits 121 and 122 are different from each other. The selection operation in the range selection part 123 is controlled by the controller 50.

The voltage adjustment circuit 12[3] includes a voltage dividing circuit 131 for generating a divided voltage of the voltage $V_{SEL}[3]$, a voltage dividing circuit 132 for generating a divided voltage of the voltage $V_{SEL}[3]$, a voltage dividing circuit 133 for generating a divided voltage of the voltage $V_{SEL}[3]$, and a range selection part 134 for selectively outputting one of the three divided voltages obtained by the voltage dividing circuits 131 to 133 to the analog wiring 13[3] as the analog voltage signal $V_A[3]$. The voltage dividing ratios in the voltage dividing circuits 131 to 133 are different from one another. The selection operation in the range selection part 134 is controlled by the controller 50.

The voltage adjustment circuit 12[4] includes a voltage dividing circuit 141 for generating a divided voltage of the voltage $V_{SEL}[4]$, a voltage dividing circuit 142 for generating a divided voltage of the voltage $V_{SEL}[4]$, and a range selection part 143 for selectively outputting one of the two divided voltages obtained by the voltage dividing circuits 141 and 142 to the analog wiring 13[4] as the analog voltage signal $V_A[4]$. The voltage dividing ratios in the voltage dividing circuits 141 and 142 are different from each other. The selection operation in the range selection part 143 is controlled by the controller 50.

The voltage adjustment circuit 12[5] is configured with a voltage dividing circuit 151 for generating a divided voltage of the voltage $V_{SEL}[5]$. The divided voltage by the voltage dividing circuit 151 is applied to the analog wiring 13[5] as the analog voltage signal $V_A[5]$.

The voltage adjustment circuit 12[6] is configured with a voltage dividing circuit 161 for generating a divided voltage of the voltage $V_{SEL}[6]$. The divided voltage by the voltage dividing circuit 161 is applied to the analog wiring 13[6] as the analog voltage signal $V_A[6]$.

The range of the measurement target voltage $V_{IN}[i]$ that can be AD-converted by the AD converter 1 will be expressed as a measurement range $R_{NG}[i]$. As a specific numerical example, a measurement range $R_{NG}[1]$ is within a range of 0 V or more and 18 V or less, and measurement ranges $R_{NG}[5]$ and $R_{NG}[6]$ are both within a range of 0 V or more and 2.5 V or less. Measurement ranges $R_{NG}[2]$ to $R_{NG}[4]$ may be set in two or three stages using the range selection parts 123, 134, and 143. That is, the measurement range $R_{NG}[2]$ is set to a range of 0 V or more and 2.5 V or less, or a range of 0 V or more and 5 V or less, depending on a state of the range selection part 123. The measurement range $R_{NG}[3]$ is set to a range of 0 V or more and 2.5 V or less, a range of 0 V or more and 5 V or less, or a range of 0 V or more and 8 V or less, depending on a state of the range selection part 134. The measurement range $R_{NG}[4]$ is set to a range of 0 V or more and 2.5 V or less, or a range of 0 V or more and 5 V or less, depending on a state of the range selection part 143.

In order to obtain the measurement ranges $R_{NG}[1]$ to $R_{NG}[6]$ described above, the resistance values of the voltage dividing resistors of the voltage dividing circuits in the voltage adjustment circuits 12[1] to 12[6] are designed and adjusted in the process at the time of shipment of the AD converter 1. The controller 50 may set the measurement ranges $R_{NG}[2]$ to $R_{NG}[4]$ through state control of the range selection parts 123, 134, and 143 based on a range setting signal received from the MPU 2 via the SPI communication. Furthermore, although the specific numerical values of the aforementioned measurement ranges are exemplified, they may be variously changed.

The controller 50 repeatedly executes a unit measurement operation (in other words, in the AD converter 1, the unit measurement operation is repeatedly executed under the control of the controller 50). The unit measurement operation includes AD conversion of the measurement target voltage for each channel and AD conversion of two types of reference voltages for each channel.

Figure 12:
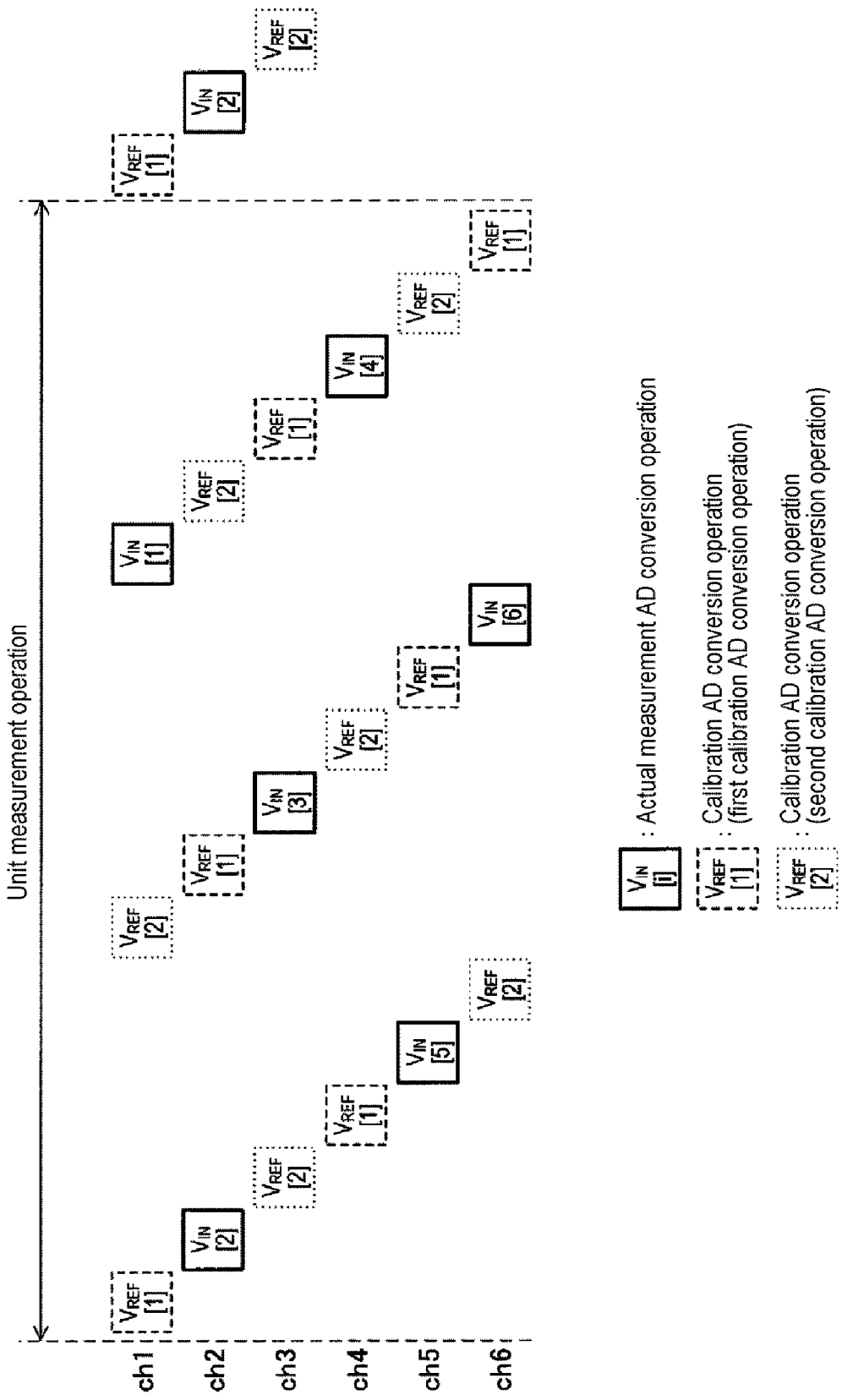
FIG. 12 is a diagram illustrating a flow of a unit measurement operation according to the second embodiment of the present disclosure.

The unit measurement operation will be specifically described with reference to FIG. 12. A one unit measurement operation consists of a first AD conversion operation to an 18th AD conversion operation. In the one unit measurement operation, it is assumed that a (p+1)th AD conversion operation is executed after a p-th AD conversion operation (where p is an integer of 1 or more and 17 or less). After the completion of the 18th AD conversion operation, a next unit measurement operation is performed. In FIG. 12, ch1 to ch6 indicate first to sixth channels, respectively, and a solid square frame indicates an actual measurement AD conversion operation, while a broken square frame indicates a calibration AD conversion operation (the same in FIGS. 13 and 14 as described later).

First, fourth, eighth, eleventh, fifteenth, and eighteenth AD conversion operations are respectively as follows:

A calibration AD conversion operation in the calibration state ST[1, 1] (i.e., an AD conversion operation for the analog voltage signal $V_A[1]$ corresponding to the reference voltage $V_{REF}[1]$), A calibration AD conversion operation in the calibration state ST[4, 1] (i.e., an AD conversion operation for the analog voltage signal $V_A[4]$ corresponding to the reference voltage $V_{REF}[1]$), A calibration AD conversion operation in the calibration state ST[2, 1] (i.e., an AD conversion operation for the analog voltage signal $V_A[2]$ corresponding to the reference voltage $V_{REF}[1]$), A calibration AD conversion operation in the calibration state ST[5, 1] (i.e., an AD conversion operation for the analog voltage signal $V_A[5]$ corresponding to the reference voltage $V_{REF}[1]$), A calibration AD conversion operation in the calibration state ST[3, 1] (i.e., an AD conversion operation for the analog voltage signal $V_A[3]$ corresponding to the reference voltage $V_{REF}[1]$), and A calibration AD conversion operation in the calibration state ST[6, 1] (i.e., an AD conversion operation for the analog voltage signal $V_A[6]$ corresponding to the reference voltage $V_{REF}[1]$).

Third, sixth, seventh, tenth, fourteenth, and seventeenth AD conversion operations are respectively as follows:

A calibration AD conversion operation in the calibration state ST[3, 2] (i.e., an AD conversion operation for the analog voltage signal $V_A[3]$ corresponding to the reference voltage $V_{REF}[2]$), A calibration AD conversion operation in the calibration state ST[6, 2] (i.e., an AD conversion operation for the analog voltage signal $V_A[6]$ corresponding to the reference voltage $V_{REF}[2]$), A calibration AD conversion operation in the calibration state ST[1, 2] (i.e., an AD conversion operation for the analog voltage signal $V_A[1]$ corresponding to the reference voltage $V_{REF}[2]$), A calibration AD conversion operation in the calibration state ST[4, 2] (i.e., an AD conversion operation for the analog voltage signal $V_A[4]$ corresponding to the reference voltage $V_{REF}[2]$), A calibration AD conversion operation in the calibration state ST[2, 2] (i.e., an AD conversion operation for the analog voltage signal $V_A[2]$ corresponding to the reference voltage $V_{REF}[2]$), and A calibration AD conversion operation in the calibration state ST[5, 2] (i.e., an AD conversion operation for the analog voltage signal $V_A[5]$ corresponding to the reference voltage $V_{REF}[2]$).

Second, fifth, ninth, twelfth, thirteenth, and sixteenth AD conversion operations are respectively as follows:

An actual measurement AD conversion operation in the actual measurement state ST[2](i.e., an AD conversion operation for the analog voltage signal $V_A[2]$ corresponding to the measurement target voltage $V_{IN}[2]$), An actual measurement AD conversion operation in the actual measurement state ST[5](i.e., AD conversion operation for the analog voltage signal $V_A[5]$ corresponding to the measurement target voltage $V_{IN}[5]$), An actual measurement AD conversion operation in the actual measurement state ST[3](i.e., an AD conversion operation for the analog voltage signal $V_A[3]$ corresponding to the measurement target voltage $V_{IN}[3]$), An actual measurement AD conversion operation in the actual measurement state ST[6](i.e., an AD conversion operation for the analog voltage signal $V_A[6]$ corresponding to the measurement target voltage $V_{IN}[6]$), An actual measurement AD conversion operation in the actual measurement state ST[1](i.e., an AD conversion operation for the analog voltage signal $V_A[1]$ corresponding to the measurement target voltage $V_{IN}[1]$), and An actual measurement AD conversion operation in the actual measurement state ST[4](i.e., an AD conversion operation for the analog voltage signal $V_A[4]$ corresponding to the measurement target voltage $V_{IN}[4]$).

Figure 18:
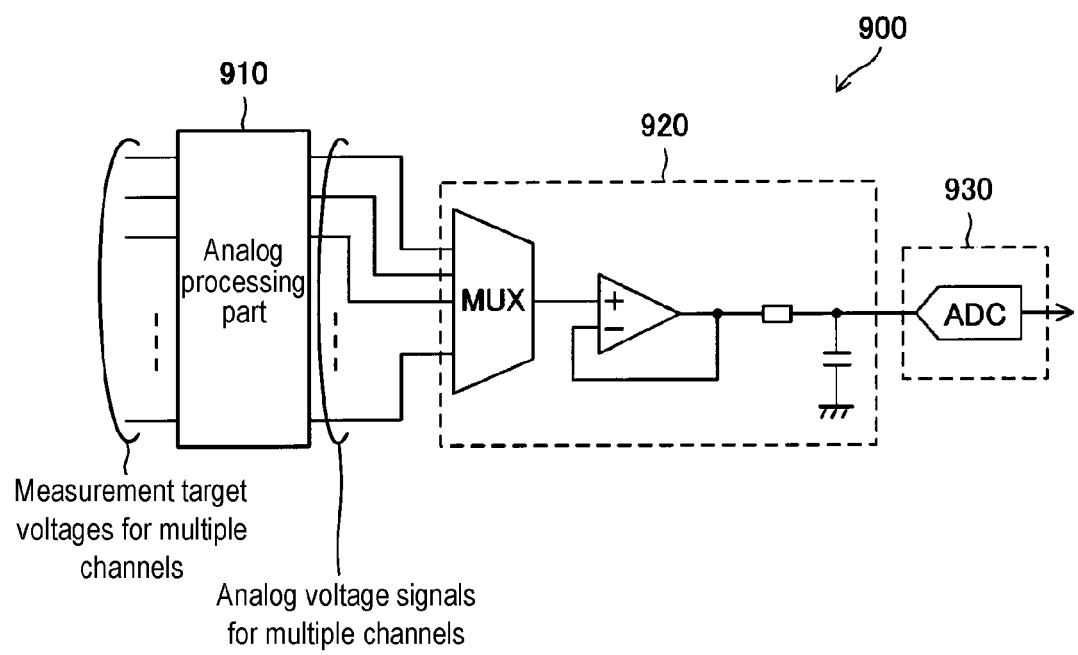
FIG. 18 is an overall configuration diagram of a general AD converter.

Herein, prior to the description of the features of the AD converter 1 illustrated in the first and second embodiments, the following reference AD converter is assumed for the sake of convenience. The reference AD converter corresponds to the AD converter 900 in FIG. 18, and the sub selection part 20S, the sub AD conversion part 30S, the sub filter block 41S, and the error determination part 44 as well as the reference voltage supply circuit 14 are omitted, with the AD converter 1 as a reference, so that the measurement target voltage $V_{IN}[i]$ is directly input to the voltage adjustment circuit 12[i]. Therefore, only the actual measurement AD conversion operation is executed in the reference AD converter, and the gain error and the offset error are not corrected in the main filter 42M of the reference AD converter.

The following abnormalities (failures) may occur in the AD converter 1 and the reference AD converter.

A first abnormality is a selection abnormality in the selection part (20M or 20S). For example, a state in which the analog voltage signal $V_A$ is selected by the selection part 20M even though the controller 50 controls so that the analog voltage signal $V_A[2]$ is selected by the selection part 20M, is included in the first abnormality.

A second abnormality is an abnormality in which the output signal of the selection part (20M or 20S) is fixed to an abnormal value. For example, an abnormality in which the output signal level of the selection part 20M is fixed to a ground level or a power supply voltage level due to a ground or a short circuit of the output of the selection part 20M is included in the second abnormality.

A third abnormality is an abnormality in which one or more analog wirings, among the analog wirings 13[1] to 13[n], are grounded or short-circuited.

A fourth abnormality is a selection abnormality of the range selection part (123, 134, or 143; see FIG. 11) in the analog processing part 10. For example, although the controller 50 controls the range selection part 123 so that the divided voltage by the voltage dividing circuit 121 is applied to the analog wiring 13[2], a state in which the divided voltage by the voltage dividing circuit 122 is applied to the analog wiring 13[2] is included in the fourth abnormality.

Further, in the analog processing part 10, the selection part (20M, 20S), and the AD conversion part (30M, 30S), there may be an abnormality which causes an excessive gain deviation or an excessive offset exceeding the design range or an abnormality in which linearity deteriorates excessively beyond the design range in the AD conversion part (30M, 30S).

The reference AD converter cannot recognize the occurrence of these abnormalities even if such abnormalities occur. On the other hand, the AD converter 1 has the plurality of AD conversion blocks and can detect, when an abnormality occurs in one of the AD conversion blocks, the abnormality by comparing a plurality of AD conversion results. This detection function is realized by the error determination part 44.

However, in the AD converter 1, if the correction of the original digital signals $V_{DO}\_M$ and $V_{DO}\_S$ using the calibration AD conversion operation is not performed, the abnormality detection described above is performed in a state in which the gain error and the offset error in the main AD conversion block and the gain error and the offset error in the sub AD conversion block are mixed, making it difficult to improve detection accuracy. In the AD converter 1 according to the first and second embodiments, the gain error and the offset error in each AD conversion block can be corrected (removed) using the AD conversion result of the predetermined reference voltage, thereby realizing abnormality detection when an abnormality occurs in one of the AD conversion blocks with high accuracy.

Furthermore, as illustrated in FIG. 12, for a section in which the unit measurement operation is performed, the controller 50 includes a section in which the first calibration AD conversion operation for one channel and the second calibration AD conversion for another channel are executed adjacent to each other (this section will be referred to as a section JA for the sake of convenience). Here, the first calibration AD conversion operation refers to an operation in which AD conversion is performed in a state in which the reference voltage $V_{REF}[1]$ is selected as the voltage $V_{SEL}[i]$, and the second calibration AD conversion operation refers to an operation in which AD conversion is performed in a state in which the reference voltage $V_{REF}[2]$ is selected as the voltage $V_{SEL}[i]$. In the unit measurement operation illustrated in FIG. 12, for example, in the third and fourth AD conversion operations adjacent to each other, the second calibration AD conversion operation for the third channel (the calibration AD conversion operation in the calibration state ST[3, 2]) and the first calibration AD conversion operation for the fourth channel (the calibration AD conversion operation in the calibration state ST[4, 1]) are executed, and in the tenth and eleventh AD conversion operations adjacent to each other, the second calibration AD conversion operation for the fourth channel (the calibration AD conversion operation in the calibration state ST[4, 2]) and the first calibration AD conversion operation for the fifth channel (the calibration AD conversion operation in the calibration state ST[5, 1]) are executed. Furthermore, the execution order of the first and second calibration AD conversion operations in the section JA may be arbitrary.

Figure 13:
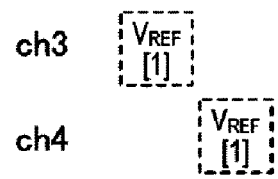
FIG. 13 is a diagram illustrating a flow of an AD conversion operation provided for comparison with the unit measurement operation in FIG. 12, according to the second embodiment of the present disclosure.

For example, as illustrated in FIG. 13, when the first calibration AD conversion operation for the fourth channel (the calibration AD conversion operation in the calibration state ST[4, 1]) is executed after the first calibration AD conversion operation for the third channel (the calibration AD conversion operation in the calibration state ST[3, 1]), since the level of the input signal of the AD conversion part (30M, 30S) does not change at all or hardly changes even if a selection abnormality (for example, an abnormality in which the analog voltage signal $V_A[3]$ of the third channel is selected in both of these conversion operations) occurs in the selection parts 20M and 20S, it may not be possible to determine the presence or absence of such a selection abnormality.

On the other hand, as illustrated in FIG. 12, for example, when the first calibration AD conversion operation for the fourth channel (the calibration AD conversion operation in the calibration state ST[4, 1]) is executed after the second calibration AD conversion operation for the third channel (the calibration AD conversion operation in the calibration state ST[3, 2]), the state of the change of the level of the input signal of the AD conversion part (30M, 30S) is completely different if such a selection abnormality occurs or does not occur. Therefore, in the AD converter 1 that performs the unit measurement operation illustrated in FIG. 12, the digital processing part 40 can determine the presence or absence of the selection abnormality in the main selection part 20M based on a difference between the original digital signal $V_{DO}$_M obtained by the second calibration AD conversion operation for the third channel and the original digital signal $V_{DO}$_M obtained by the first calibration AD conversion operation for the fourth channel and determine the presence or absence of the selection abnormality in the sub selection part 202 based on a difference between the original digital signal $V_{DO}$_S obtained by the second calibration AD conversion operation for the third channel and the original digital signal $V_{DO}$_S obtained by the first calibration AD conversion operation for the fourth channel.

Figure 14:
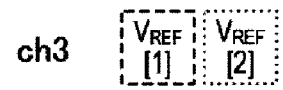
FIG. 14 is a diagram illustrating a flow of an AD conversion operation provided for comparison with the unit measurement operation in FIG. 12, according to the second embodiment of the present disclosure.

As illustrated in FIG. 14, for example, a method in which the second calibration AD conversion operation for the third channel (the calibration AD conversion operation in the calibration state ST[3, 2]) is executed after the first calibration AD conversion operation for the third channel (the calibration AD conversion operation in the calibration state ST[3, 1]) is also possible. However, this method cannot detect an abnormality in which the output signals of the selection parts 20M and 20S are fixed by the analog voltage signal $V_A$[3]. In consideration of this, it is configured so that the selected channels by the selection parts 20M and 20S are sequentially changed in the unit measurement operation of FIG. 12.

Then, by inserting the actual measurement AD conversion operation for obtaining AD conversion results of the measurement target voltages $V_{IN}$[1] to $V_{IN}$[6] into the unit measurement operation, the AD conversion of the measurement target voltages $V_{IN}$[1] to $V_{IN}$[6]] is ensured. As illustrated in FIG. 12, for a section in which the unit measurement operation is executed, the controller 50 includes a section in which the first calibration AD conversion operation for any channel, the second calibration AD conversion operation for another channel, and the actual measurement AD conversion operation for yet another channel are executed adjacent to each other (in other words, continuously) (this section will be referred to as a section JB for the sake of convenience). The execution order of the first and second calibration AD conversion operations and the actual measurement AD conversion operations in the section JB may be arbitrary. In FIG. 12, the section in which the third to fifth AD conversion operations are executed and the section in which the first to third AD conversion operations are executed are examples of the section JB.

The second embodiment includes the following examples EX2_1 to EX2_5. As long as there is no contradiction, the matters described in any of the examples EX2_1 to EX2_5 may be applied to any other example (i.e., any two or more of the plurality of examples may be combined).

Example EX2_1

Example EX2_1 will be described. In the unit measurement operation, the corrected digital signals $V_{DF}$_M and $V_{DF}$_S obtained by the AD conversion operation are stored in the memory 45 as data each time the AD conversion operation is performed. At this time, the original digital signals $V_{DO}$_M and $V_{DO}$_S may be stored in the memory 45 as data. After a certain amount or more of data is stored in the memory 45, newly acquired data may be overwritten and stored on the old data in time series. The filter blocks 41M and 41S may set the main filter parameter and the sub filter parameter based on the contents stored in the memory 45.

The filter blocks 41M and 41S may set the parameters using the following method EX2_1$_A$ or EX2_1B.

In the method EX2_1A, the main filter block 41M sets the main filter parameter based on the original digital signal $V_{DO}$_M obtained by a one-time first calibration AD conversion operation and the original digital signal $V_{DO}$_M obtained by a one-time second calibration AD conversion operation, and the sub filter block 41S sets the sub filter parameter based on the original digital signal $V_{DO}$_S obtained by the one-time first calibration AD conversion operation and the original digital signal $V_{DO}$_S obtained by the one-time second calibration AD conversion operation.

In the method EX2_1B, the main filter block 41M sets the main filter parameter based on a plurality of original digital signals $V_{DO}$_M obtained by multiple first calibration AD conversion operations and a plurality of original digital signals $V_{DO}$_M obtained by multiple second calibration AD conversion operations, and the sub filter block 41S sets the sub filter parameter based on a plurality of original digital signals $V_{DO}$_S obtained by the multiple first calibration AD conversion operations and a plurality of original digital signals $V_{DO}$_S obtained by the multiple second calibration AD conversion operations.

Even when any of the methods EX2_1A and EX2_1B is adopted, the main filter parameter and the sub filter parameter may be sequentially updated and set using the latest original digital signals $V_{DO}$_M and $V_{DO}$_S obtained by the first and second calibration AD conversion operations. The digital processing part 40 may evaluate the state of deterioration over time in the main AD conversion block based on a change of the main filter parameter in time series, may evaluate the state of deterioration over time in the sub AD conversion block based on a change of the sub filter parameter in time series, or may output a signal corresponding to the evaluation result to the MPU 2 via the communication terminal $TM_{COM}$. Also, the digital processing part 40 may output the data stored in the memory 45 to the MPU 2 via the communication terminal $TM_{COM}$, and the MPU 2 may evaluate the state of deterioration over time based on the data.

Furthermore, even when any of the method EX2_1A and EX2_1B is adopted, the individual setting method MTD1 or the common setting method MTD2 described above may be arbitrarily used.

Example EX2_2

Example EX2_2 will be described. The controller 50 may perform an initial calibration operation before the unit measurement operation starts after the AD converter 1 is activated. The initial calibration operation excludes the actual measurement AD conversion operation from the unit measurement operation in FIG. 12, and the filter blocks 41M and 41S set an initial value of the main filter parameter and an initial value of the sub filter parameter in the initial calibration operation. However, the initial calibration operation may be similar to the unit measurement operation in FIG. 12, and the AD conversion result obtained by the actual measurement AD conversion operation during the initial calibration operation is not provided to the MPU 2.

After the main filter parameter and the sub filter parameter are set through the initial calibration operation, the corrected digital signals $V_{DF}$_M and $V_{DF}$_S are expected to be kept substantially equal in the respective AD conversion operations by the correction function by the filters 42M and 42S, but when an abnormality such as a short circuit of the output of the main selection part 20M occurs, the difference between the signals $V_{DF\_M}$ and $V_{DF\_S}$ becomes very large, causing the output of the error determination signal SE to be "1."

Example EX2_3

Example EX2_3 will be described. When the signals $V_{DF\_M}$ and $V_{DF\_S}$ obtained by the calibration AD conversion operation are input, the error determination part 44 may determine whether there is an abnormality in either the main AD conversion block or the sub AD conversion block based on the values of the signals $V_{DF\_M}$ and $V_{DF\_S}$ when the magnitude of the difference $|V_{DIF}|$ between the signals $V_{DF\_M}$ and $V_{DF\_S}$ is larger than the predetermined threshold $V_{TH}$, and output the error determination signal SE including the determination result.

For example, both of the signals $V_{DF\_M}$ and $V_{DF\_S}$ obtained by the calibration AD conversion operation in the calibration state ST[1, 1] (i.e., the AD conversion operation for the analog voltage signal $V_A[1]$ corresponding to the reference voltage $V_{REF}[1]$) should have values substantially corresponding to the reference voltage $V_{REF}[1]$ if there is no abnormality. Therefore, it is possible to determine whether there is an abnormality in either the main AD conversion block or the sub AD conversion block by individually determining whether or not the values of the signals $V_{DF\_M}$ and $V_{DF\_S}$ fall within a predetermined range.

When it is determined that there is an abnormality in one of the main AD conversion block and the sub AD conversion block, the operation of the functional circuit 43 may be continued based on only the AD conversion result by another AD conversion block or the operation of the AD converter 1 (including the AD conversion operation) may be stopped.

Example EX2_4

Example EX2_4 will be described. Each of the voltage adjustment circuits (12[1] to 12[6]) may not have a measurement range selection function.

Example EX2_5

Example EX2_5 will be described. As described above, the reference voltage $V_{REFAD}$ (see FIG. 5), which is used in the AD converters 31M and 31S, is a voltage different from the reference voltage generated by the reference voltage supply circuit 14, and is generated by a reference voltage generation circuit (not shown) installed separately from the reference voltage supply circuit 14. Therefore, when an abnormality (failure) occurs in any one of that reference voltage generation circuit and the reference voltage supply circuit 14, the abnormality (failure) can be detected. This will be described in relation to the circuits and operations specifically illustrated in the second embodiment. Furthermore, the reference voltage generation circuit (not shown) will be referred to as a reference voltage generation circuit $G_{AD}$ for convenience of description.

In the reference voltage supply circuit 14 (see FIG. 11) according to the second embodiment, the two reference voltages $V_{REF}[1]$ and $V_{REF}[^2]$ are generated based on the DC voltage $V_{REF}$, in which the voltage $V_{REF}$ is also considered as one of the reference voltages generated by the reference voltage supply circuit 14. In addition, although it is different from an actual case, a configuration (hereinafter, referred to as a virtual configuration) is assumed in which the reference voltage $V_{REFAD}$ and the reference voltage $V_{REF}$ are generated by a common circuit and become the same voltage $V_{COM}$. In the virtual configuration, when any abnormality (failure) occurs in the common circuit and the value of the voltage $V_{COM}$ drops below a predetermined design value, since the reference voltages $V_{REF}[1]$ and $V_{REF}[2]$ drop and at the same time the reference voltage $V_{REFAD}$ drops, no change occurs in the outputs of the AD converters 31M and 31S. Therefore, it is not possible to determine whether or not the abnormality has occurred from the outputs of the AD converters 31M and 31S.

On the other hand, in the actual configuration in which the reference voltage $V_{REFAD}$ is generated by the reference voltage generation circuit $G_{AD}$ separately from the reference voltages $V_{REF}$, $V_{REF}[1]$, and $V_{REF}[^2]$, when an abnormality (failure) occurs in any one of the reference voltage generation circuit $G_{AD}$ and the reference voltage supply circuit 14, the abnormality (failure) can be detected.

A specific description will be given assuming that the reference voltage $V_{REF}[1]$ when there is no abnormality in the reference voltage supply circuit 14 is 0.5 V. For example, both of the signals $V_{DF\_M}$ and $V_{DF\_S}$ obtained by the calibration AD conversion operation in the calibration state ST[1, 1] (i.e., the AD conversion operation for the analog voltage signal $V_A[1]$ corresponding to the reference voltage $V_{REF}[1]$) should have a value substantially corresponding to the reference voltage $V_{REF}[1]$ (a value corresponding to 0.5 V) if there is an abnormality in both the reference voltage generation circuit $G_{AD}$ and the reference voltage supply circuit 14.

When an abnormality occurs in the reference voltage supply circuit 14 and the value of the reference voltage $V_{REF}$ is reduced to half of a predetermined design value, the signals $V_{DF\_M}$ and $V_{DF\_S}$ obtained by the calibration AD conversion operation in the calibration state ST[1, 1] are about half the value corresponding to the original reference voltage $V_{REF}[1]$ (i.e., a value corresponding to 0.25 V). Thus, the abnormality can be detected. The same applies to when the value of the reference voltage $V_{REF}$ becomes abnormally higher than the design value, and the same applies to when an abnormality occurs not in the reference voltage supply circuit 14 but in the reference voltage generation circuit $G_{AD}$.

In practice, the operations may be performed as follows. The digital processing part 40 (for example, the error determination part 44) determines whether or not the values of the signals $V_{DF\_M}$ and $V_{DF\_S}$ fall within a predetermined range based on the signals $V_{DF\_M}$ and $V_{DF\_S}$ obtained by the calibration AD conversion operation in the calibration state ST[i, j] (i.e., the AD conversion operation for the analog voltage signal $V_A[i]$ corresponding to the reference voltage $V_{REF}[j]$), and when the values of the signals $V_{DF\_M}$ and $V_{DF\_S}$ all deviate from the predetermined range, it determines that an abnormality occurs in either the voltage supply circuit 14 or the reference voltage generation circuit $G_{AD}$AD. When the occurrence of such an abnormality is detected, this fact may be transmitted to the MPU 2. When only one of the values of the signals $V_{DF\_M}$ and $V_{DF\_S}$ deviates from the predetermined range, it is considered that the difference between the signals $V_{DF\_M}$ and $V_{DF\_S}$ becomes correspondingly large, and the error determination signal SE of "1" is output by the aforementioned method based on the difference between the signals $V_{DF\_M}$ and $V_{DF\_S}$.

In addition, although the aforementioned merits cannot be obtained, the virtual configuration described above may be employed in the present disclosure.

Third Embodiment

Figure 15:
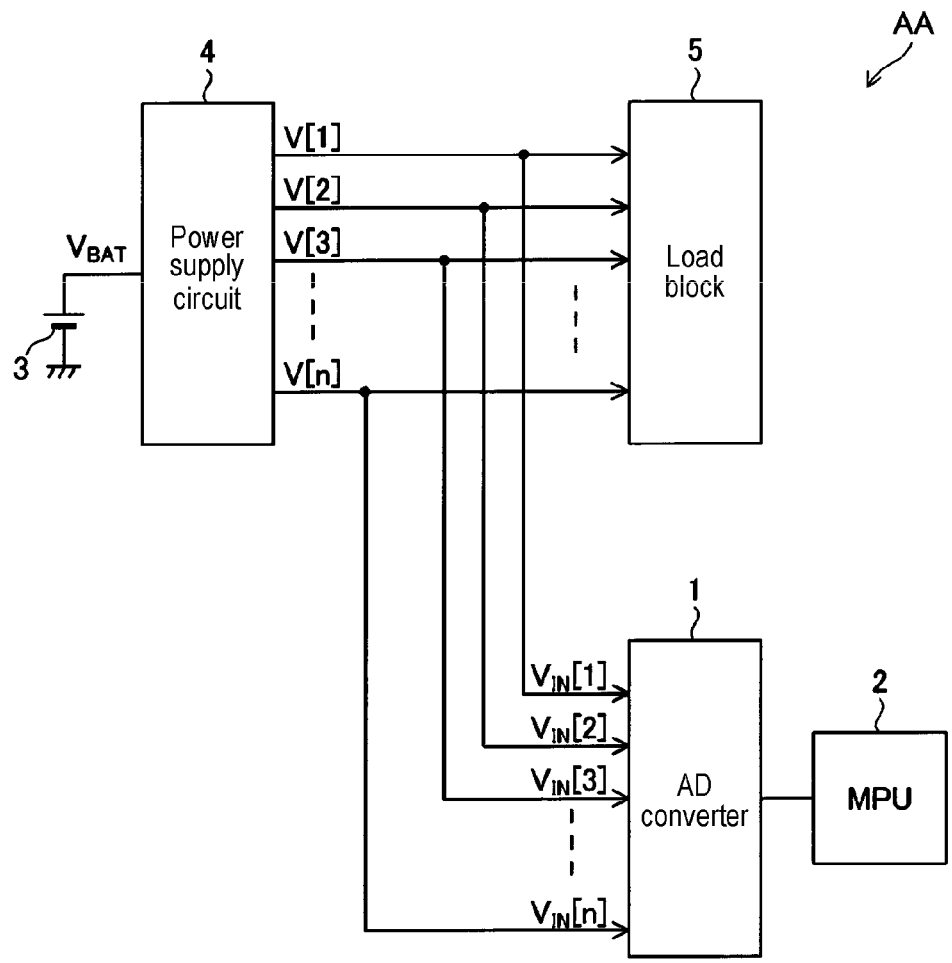
FIG. 15 is an overall configuration diagram of a load driving system according to a third embodiment of the present disclosure.

The third embodiment of the present disclosure will be described. The AD converter 1 is incorporated in an arbitrary system and can receive any type of voltages as the measurement target voltages, but an example in which it is applied to a load driving system AA mounted on a vehicle such as an automobile or the like will be described below. FIG. 15 is an overall configuration diagram of the load driving system AA.

The load driving system AA includes a power supply circuit 4 for generating and outputting n types of DC voltages V[1] to V[n] based on an output voltage $V_{BAT}$ of a battery 3 mounted on a vehicle, a load block 5 configured by a plurality of loads (e.g., n loads) for driving the DC voltages V[1] to V[n] as driving voltages, an AD converter 1 for receiving the DC voltages V[1] to V[n] as measurement target voltages $V_{IN}$[1] to $V_{IN}$[n], and an MPU 2 connected to the AD converter 1. Any of the DC voltages V[1] to V[n] may be a power supply voltage of the AD converter 1.

A circuit constituting a controller area network (CAN) of the vehicle, a microcomputer for running control of the vehicle, a sensor for detecting the speed of the vehicle, an air conditioning device for the vehicle, or the like may be used as a load constituting the load block 5. The MPU 2 may be a load in the load block 5.

The AD converter 1 may sequentially AD-convert the measurement target voltages $V_{IN}$[1] to $V_{IN}$[n] of the DC voltages V[1] to V[n], and output the AD conversion results to the MPU 2. At this time, the AD conversion results of the measurement target voltages $V_{IN}$[1] to $V_{IN}$[n] indicated by the corrected digital signal $V_{DF}$_M (or $V_{DF}$_S) may be output to the MPU 2.

Furthermore, the functional circuit 43 (see FIG. 1) may determine whether or not the AD conversion result of the measurement target voltage falls within a predetermined normal range for each measurement target voltage, and output the determination result to the MPU 2. For example, when the load driving system AA is configured so that the DC voltage V[1] is 5 V, the normal range is set with reference to 5 V, and when the corrected digital signal $V_{DF}$_M obtained by the actual measurement AD conversion operation in the actual measurement state ST[1] (i.e., the AD conversion operation for the analog voltage signal $V_A$[1] corresponding to the measurement target voltage $V_{IN}$[1]) deviates from the normal range, the functional circuit 43 may output a signal indicating that fact to the MPU 2. Also, the normal range may be set based on a signal provided from the MPU 2 to the AD converter 1 through the SPI communication. The point that the error determination signal SE (see FIG. 1) is output to the MPU 2 is as described above.

Fourth Embodiment

The fourth embodiment of the present disclosure will be described. In the fourth embodiment, an application technique, a modification technique, and the like applicable to the first to third embodiments described above will be described.

The first AD conversion block, which is one of the two AD conversion blocks installed in the AD converter 1, will be referred to as a main AD conversion block, and the second conversion block, which is the other AD conversion block, will be referred to as a sub AD conversion block without a master/slave relationship or a superior/inferior relationship between the first and second AD conversion blocks.

Three or more AD conversion blocks may be installed in the AD converter 1.

Figure 16:
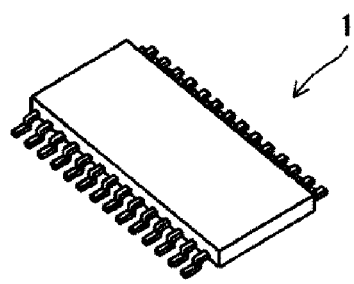
FIG. 16 is a diagram illustrating an example of an external appearance of an AD converter according to a fourth embodiment of the present disclosure.

FIG. 16 illustrates an example of an external appearance of the AD converter 1. The AD converter 1 is an electronic component (semiconductor device) formed by enclosing a semiconductor integrated circuit in a housing (package) made of resin. Each circuit constituting the AD converter 1 is integrated with a semiconductor. A plurality of external terminals exposed from the housing to the outside of the AD converter 1 are installed in the housing of the electronic component as the AD converter 1. Among the plurality of external terminals exposed from the housing, the input terminals TM[1] to TM[n] and the communication terminal $TM_{COM}$ described above are included. The number of external terminals illustrated in FIG. 16 is merely an example. The type of the housing of the AD converter 1 is arbitrary.

However, any part or all of the circuits constituting the AD converter 1 of FIG. 1 may be configured using discrete components.

Figure 17:
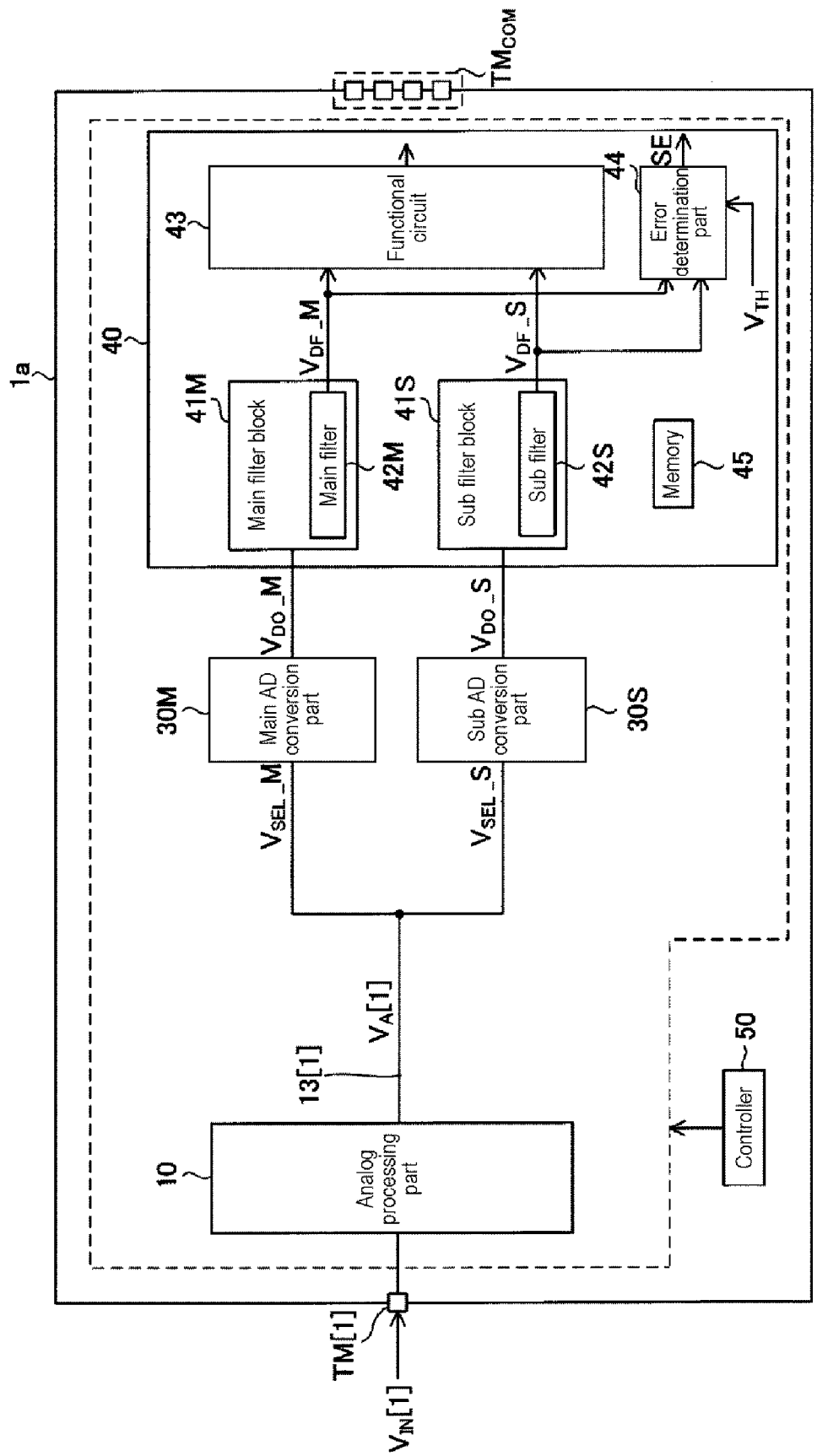
FIG. 17 is an overall configuration diagram of a modified AD converter according to the fourth embodiment of the present disclosure.

The configuration and operation of the AD converter 1 have been described on the assumption that a plurality of measurement target voltages are input to the AD converter 1, but the number of measurement target voltages input to the AD converter 1 may be only one. That is, "n=1" may be used in the AD converter 1. When "n=1," the selection parts 20M and 20S are not necessary in the AD converter 1, and the analog voltage signal $V_A$[1] is always applied to the conversion parts 30M and 30S as the signals $V_{SEL}$_M and $V_{SEL}$_S. FIG. 17 illustrates the configuration of the AD converter 1 when "n=1" as a configuration of an AD converter 1a. Even when "n=1," the error determination part 44 advantageously functions with respect to detection of abnormality except for the abnormality of the selection parts 20M and 20S.

An AD converter according to one aspect of the present disclosure is directed to an AD converter 1 for performing analog-digital conversion (AD conversion) on measurement target voltages $V_{IN}$[1] to $V_{IN}$[n] for a plurality of channels, and includes an analog processing part 10 configured to select one of the measurement target voltage and a plurality of reference voltages for each of the channels to output an analog voltage signal corresponding to the selected voltage, a first selection part 20M configured to select one of a plurality of analog voltage signals $V_A$[1] to $V_A$[n] for the plurality of channels output from the analog processing part; and the first selection part, a first AD conversion part 30M configured to perform AD conversion on the analog voltage signal selected by the first selection part to generate a first original digital signal $V_{DO}$_M, a second selection part 20S configured to select one of the plurality of analog voltage signals, a second AD conversion part 30S configured to perform AD conversion on the analog voltage signal selected by the second selection part to generate a second original digital signal $V_{DO}$_S, a digital processing part 40 configured to receive the first original digital signal and the second original digital signal, and a controller 50 configured to control selected contents in the analog processing part, the first selection part, and the second selection part, wherein the plurality of reference voltages include a first reference voltage and a second reference voltage $V_{REF}$[1] and $V_{REF}$[2] different from each other, and the digital processing part includes a first filter block 41M having a first filter 42M configured to generate a first corrected digital signal $V_{DF}$_M from the first original digital signal based on a first parameter, and configured to set the first parameter based on the first original digital signal obtained when the first reference voltage is selected by the analog processing part and the first original digital signal obtained when the second reference voltage is selected by the analog processing part; a second filter block 41S having a second filter 42S configured to generate a second corrected digital signal $V_{DF\_}S$ from the second original digital signal based on a second parameter, and configured to set the second parameter based on the second original digital signal obtained when the first reference voltage is selected by the analog processing part and the second original digital signal obtained when the second reference voltage is selected by the analog processing part; and an error determination part 44 configured to output a predetermined error determination signal based on the first corrected digital signal and the second corrected digital signal.

According to the present disclosure in some embodiments, it is possible to provide an AD converter capable of evaluating validity of a circuit for obtaining an AD conversion result of a measurement target voltage or an AD converter that contributes to detection of an abnormality in operation, in other words, of a circuit or operation for obtaining an AD conversion result of a measurement target voltage.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An analog-digital (AD) converter for performing AD conversion on measurement target voltages for a plurality of channels, comprising:
    an analog processing part configured to select one of the measurement target voltages and a plurality of reference voltages for each of the channels, to output an analog voltage signal corresponding to the selected voltage;
    a first selection part configured to select one of a plurality of analog voltage signals for the plurality of channels output from the analog processing part;
    a first AD conversion part configured to perform AD conversion on the analog voltage signal selected by the first selection part to generate a first original digital signal;
    a second selection part configured to select one of the plurality of analog voltage signals;
    a second AD conversion part configured to perform AD conversion on the analog voltage signal selected by the second selection part to generate a second original digital signal;
    a digital processing part configured to receive the first original digital signal and the second original digital signal; and
    a controller configured to control contents selected in the analog processing part, the first selection part, and the second selection part,
    wherein the plurality of reference voltages include a first reference voltage and a second reference voltage different from each other, and
    wherein the digital processing part includes:
        a first filter block having a first filter configured to generate a first corrected digital signal from the first original digital signal based on a first parameter, and configured to set the first parameter based on the first original digital signal obtained when the first reference voltage is selected by the analog processing part and the first original digital signal obtained when the second reference voltage is selected by the analog processing part;
        a second filter block having a second filter configured to generate a second corrected digital signal from the second original digital signal based on a second parameter, and configured to set the second parameter based on the second original digital signal obtained when the first reference voltage is selected by the analog processing part and the second original digital signal obtained when the second reference voltage is selected by the analog processing part; and
        an error determination part configured to output a predetermined error determination signal based on the first corrected digital signal and the second corrected digital signal.

2. The AD converter of claim 1, wherein the plurality of channels include first to n-th channels where n is an integer of 2 or more,
    wherein the measurement target voltages for the plurality of channels include first to n-th measurement target voltages,
    wherein the analog processing part includes first to n-th switch circuits and first to n-th analog wirings,
    wherein each of the first selection part and the second selection part is connected to the first to n-th analog wirings, and the first to n-th analog voltage signals are input as the plurality of analog voltage signals to each of the first selection part and the second selection part, and
    wherein, in an i-th channel, either an i-th measurement target voltage or the plurality of reference voltages are selected by an i-th switch circuit, and an i-th analog voltage signal corresponding to the selected voltage is applied to an i-th analog wiring where i is an integer of 1 or more and n or less.

3. The AD converter of claim 2, wherein a state of the AD converter may be one of an actual measurement state, a first calibration state, and a second calibration state for each channel by the controller,
    wherein, in the actual measurement state for the i-th channel, the i-th switch circuit, the first selection part, and the second selection part are controlled so that the i-th measurement target voltage is selected by the i-th switch circuit, and the i-th analog voltage signal corresponding to the i-th measurement target voltage is selected by the first selection part and the second selection part, and
    wherein, in the first calibration state for the i-th channel, the i-th switch circuit, the first selection part, and the second selection part are controlled so that the first reference voltage is selected by the i-th switch circuit, and the i-th analog voltage signal corresponding to the first reference voltage is selected by the first selection part and the second selection part, and
    wherein, in the second calibration state for the i-th channel, the i-th switch circuit, the first selection part, and the second selection part are controlled so that the second reference voltage is selected by the i-th switch circuit, and the i-th analog voltage signal corresponding to the second reference voltage is selected by the first selection part and the second selection part, and wherein an actual measurement AD conversion operation for performing AD conversion in the first AD conversion part and the second AD conversion part in the actual measurement state, a first calibration AD conversion operation for performing AD conversion in the first AD conversion part and the second AD conversion part in the first calibration state, and a second calibration AD conversion operation for performing AD conversion in the first AD conversion part and the second AD conversion part in the second calibration state are executed for each channel under the control of the controller.

4. The AD converter of claim 3, wherein, for a section in which the actual measurement AD conversion operation, the first calibration AD conversion operation, and the second calibration AD conversion operation for the first to n-th channels are executed, the controller includes a section in which the first calibration AD conversion operation for any one channel and the second calibration AD conversion operation for another channel are executed adjacent to each other.

5. The AD converter of claim 3, wherein, for a section in which the actual measurement AD conversion operation, the first calibration AD conversion operation, and the second calibration AD conversion operation for the first to n-th channels are executed, the controller includes a section in which the first calibration AD conversion operation for one channel, the second calibration AD conversion operation for another channel, and the actual measurement AD conversion operation for yet another channel are executed adjacent to one another.

6. The AD converter of claim 2, wherein the first filter block is configured to set the first parameter for each channel,
wherein the second filter block is configured to set the second parameter for each channel,
wherein the first filter block is configured to set the first parameter for the i-th channel based on the first original digital signal obtained from the first AD conversion part when the first reference voltage is selected by the i-th switch circuit and the i-th analog voltage signal is selected by the first selection part, and based on the first original digital signal obtained from the first AD conversion part when the second reference voltage is selected by the i-th switch circuit and the i-th analog voltage signal is selected by the first selection part, and
wherein the second filter block is configured to set the second parameter for the i-th channel based on the second original digital signal obtained from the second AD conversion part when the first reference voltage is selected by the i-th switch circuit and the i-th analog voltage signal is selected by the second selection part, and based on the second original digital signal obtained from the second AD conversion part when the second reference voltage is selected by the i-th switch circuit and the i-th analog voltage signal is selected by the second selection part.

7. The AD converter of claim 2, wherein the first filter block is configured to set the first parameter common to the first to n-th channels,
wherein the second filter block is configured to set the second parameter common to the first to n-th channels,
wherein the first filter block is configured to set the first parameter for the first to n-th channels based on the first original digital signal obtained from the first AD conversion part when the first reference voltage is selected by the first switch circuit and the first analog voltage signal is selected by the first selection part, and based on the first original digital signal obtained from the first AD conversion part when the second reference voltage is selected by the first switch circuit and the first analog voltage signal is selected by the first selection part, and
wherein the second filter block is configured to set the second parameter for the first to n-th channels based on the second original digital signal obtained from the second AD conversion part when the first reference voltage is selected by the first switch circuit and the first analog voltage signal is selected by the second selection part, and based on the second original digital signal obtained from the second AD conversion part when the second reference voltage is selected by the first switch circuit and the i-th analog voltage signal is selected by the second selection part.

8. The AD converter of claim 1, wherein the error determination signal is output based on the error determination part, and a comparison result between a magnitude of a difference between the first corrected digital signal and the second corrected digital signal and a predetermined threshold value.

9. An analog-digital (AD) converter for performing AD conversion on measurement target voltages, comprising:
an analog processing part configured to select one of the measurement target voltages and a plurality of reference voltages to output an analog voltage signal corresponding to the selected voltage;
a first AD conversion part configured to perform AD conversion on the analog voltage signal to generate a first original digital signal;
a second AD conversion part configured to perform AD conversion on the analog voltage signal to generate a second original digital signal;
a digital processing part configured to receive the first original digital signal and the second original digital signal; and
a controller configured to control contents selected in the analog processing part, a first selection part, and a second selection part,
wherein the plurality of reference voltages include a first reference voltage and a second reference voltage different from each other, and
the digital processing part includes:
a first filter block having a first filter configured to generate a first corrected digital signal from the first original digital signal based on a first parameter, and configured to set the first parameter based on the first original digital signal obtained when the first reference voltage is selected by the analog processing part and the first original digital signal obtained when the second reference voltage is selected by the analog processing part;
a second filter block having a second filter configured to generate a second corrected digital signal from the second original digital signal based on a second parameter, and configured to set the second parameter based on the second original digital signal obtained when the first reference voltage is selected by the analog processing part and the second original digital signal obtained when the second reference voltage is selected by the analog processing part; and
an error determination part configured to output a predetermined error determination signal based on the first corrected digital signal and the second corrected digital signal.

10. The AD converter of claim 9, wherein the error determination signal is output based on the error determination part, and a comparison result between a magnitude of a difference between the first corrected digital signal and the second corrected digital signal and a predetermined threshold value.

\* \* \* \* \*